US008552536B2

(12) United States Patent
Sasagawa et al.

(10) Patent No.: US 8,552,536 B2
(45) Date of Patent: Oct. 8, 2013

(54) FLEXIBLE INTEGRATED CIRCUIT DEVICE LAYERS AND PROCESSES

(75) Inventors: Teruo Sasagawa, Los Gatos, CA (US); Brian Arbuckle, Danville, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 74 days.

(21) Appl. No.: 12/970,140

(22) Filed: Dec. 16, 2010

(65) Prior Publication Data

US 2012/0154690 A1    Jun. 21, 2012

(51) Int. Cl.
*H01L 23/58*    (2006.01)

(52) U.S. Cl.
USPC ............ 257/635; 257/E21.476; 257/E23.002; 438/612

(58) Field of Classification Search
USPC ........... 257/635, E21.476, E23.002; 438/612
See application file for complete search history.

(56) References Cited

U.S. PATENT DOCUMENTS

| | | | |
|---|---|---|---|
| 6,093,584 | A | 7/2000 | Fjelstad |
| 7,569,488 | B2 | 8/2009 | Rafanan |
| 7,633,159 | B2 | 12/2009 | Boon et al. |
| 2002/0030189 | A1 | 3/2002 | Ishikawa |
| 2003/0157783 | A1 | 8/2003 | Fonash et al. |
| 2004/0194294 | A1* | 10/2004 | Fjelstad ........................ 29/620 |
| 2007/0249078 | A1* | 10/2007 | Tung et al. ..................... 438/48 |
| 2007/0254456 | A1 | 11/2007 | Maruyama et al. |
| 2009/0224402 | A1 | 9/2009 | Do et al. |
| 2009/0230542 | A1 | 9/2009 | Lin et al. |
| 2010/0120232 | A1 | 5/2010 | Kim et al. |
| 2010/0124795 | A1 | 5/2010 | Eguchi et al. |
| 2010/0171227 | A1* | 7/2010 | Baleras et al. ................ 257/777 |
| 2012/0154690 | A1 | 6/2012 | Sasagawa et al. |

FOREIGN PATENT DOCUMENTS

| | | |
|---|---|---|
| TW | 201232678 | 8/2012 |
| WO | 2012082358 | 6/2012 |

OTHER PUBLICATIONS

International Search Report and Written Opinion—PCT/US2011/062417—ISAEPO—Mar. 22, 2012.
Written Opinion of the International Preliminary Examining Authority—PCT/US2011/062417—ISAEPO—Nov. 29, 2012.

* cited by examiner

*Primary Examiner* — Marvin Payen
(74) *Attorney, Agent, or Firm* — Weaver Austin Villeneuve & Sampson LLP

(57) ABSTRACT

This disclosure provides systems, processes, and apparatus implementing and using techniques for fabricating flexible integrated circuit (IC) device layers. In one implementation, a sacrificial layer is deposited on a substrate. The sacrificial layer can include amorphous silicon or molybdenum, by way of example. One or more electronic components are formed on the sacrificial layer. A polymer coating is provided on the one or more electronic components to define a coated device layer. The sacrificial layer is removed to release the coated device layer from the substrate. The sacrificial layer can be removed using a xenon difluoride gas or by etching, for example. Coated device layers made in accordance with this process can be stacked. The substrate can be formed of glass, silicon, a plastic, a ceramic, a compound semiconductor, and/or a metal, depending on the desired implementation. The electronic component(s) can include a passive component such as a resistor, an inductor, or a capacitor. The electronic component(s) can also or alternatively include an active component such as a transistor.

19 Claims, 30 Drawing Sheets

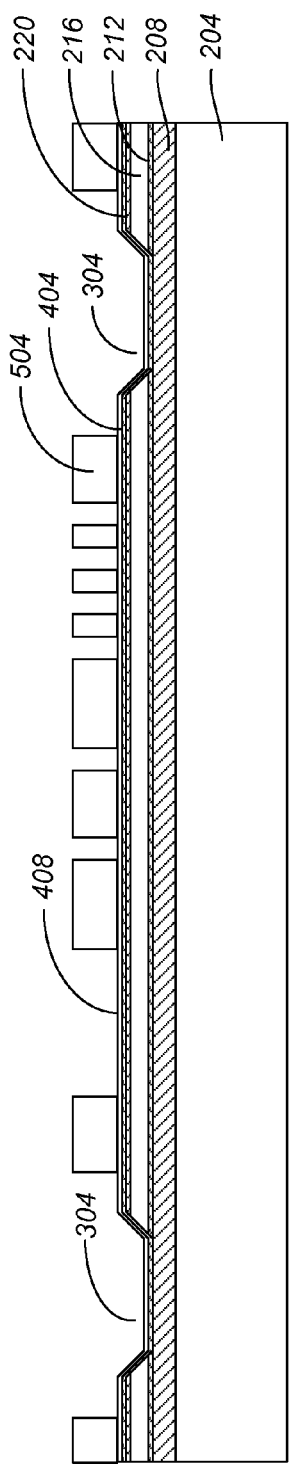
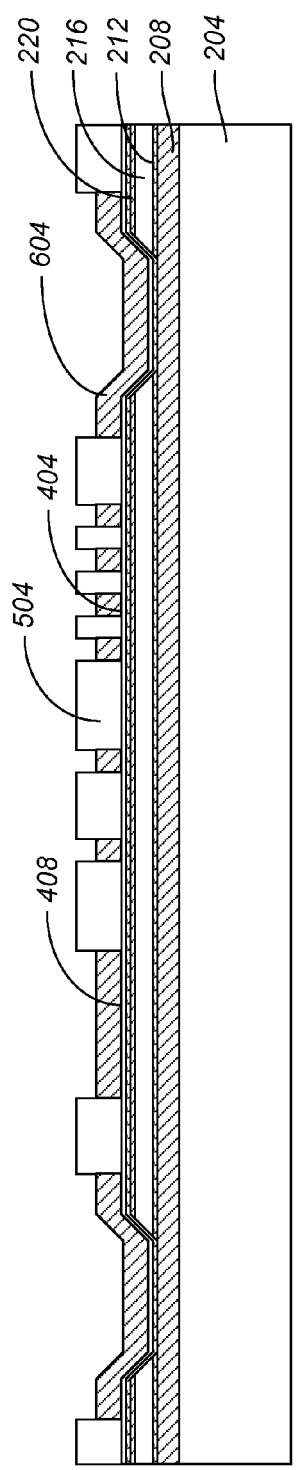
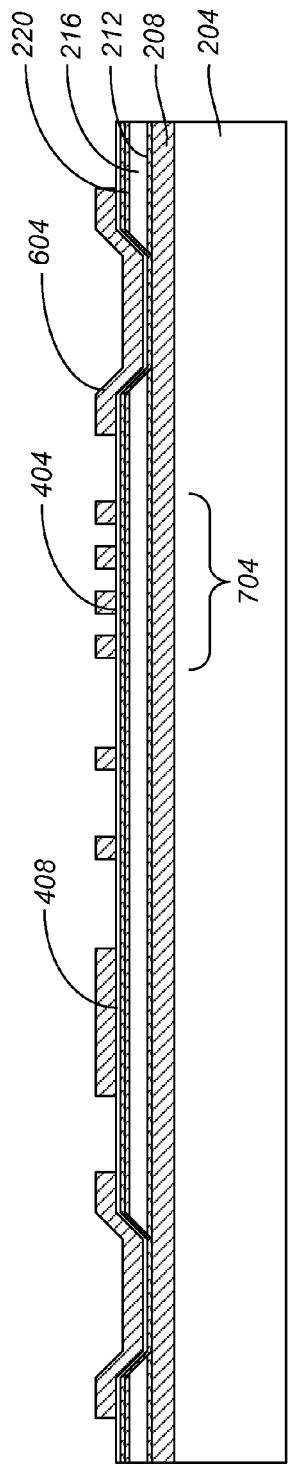

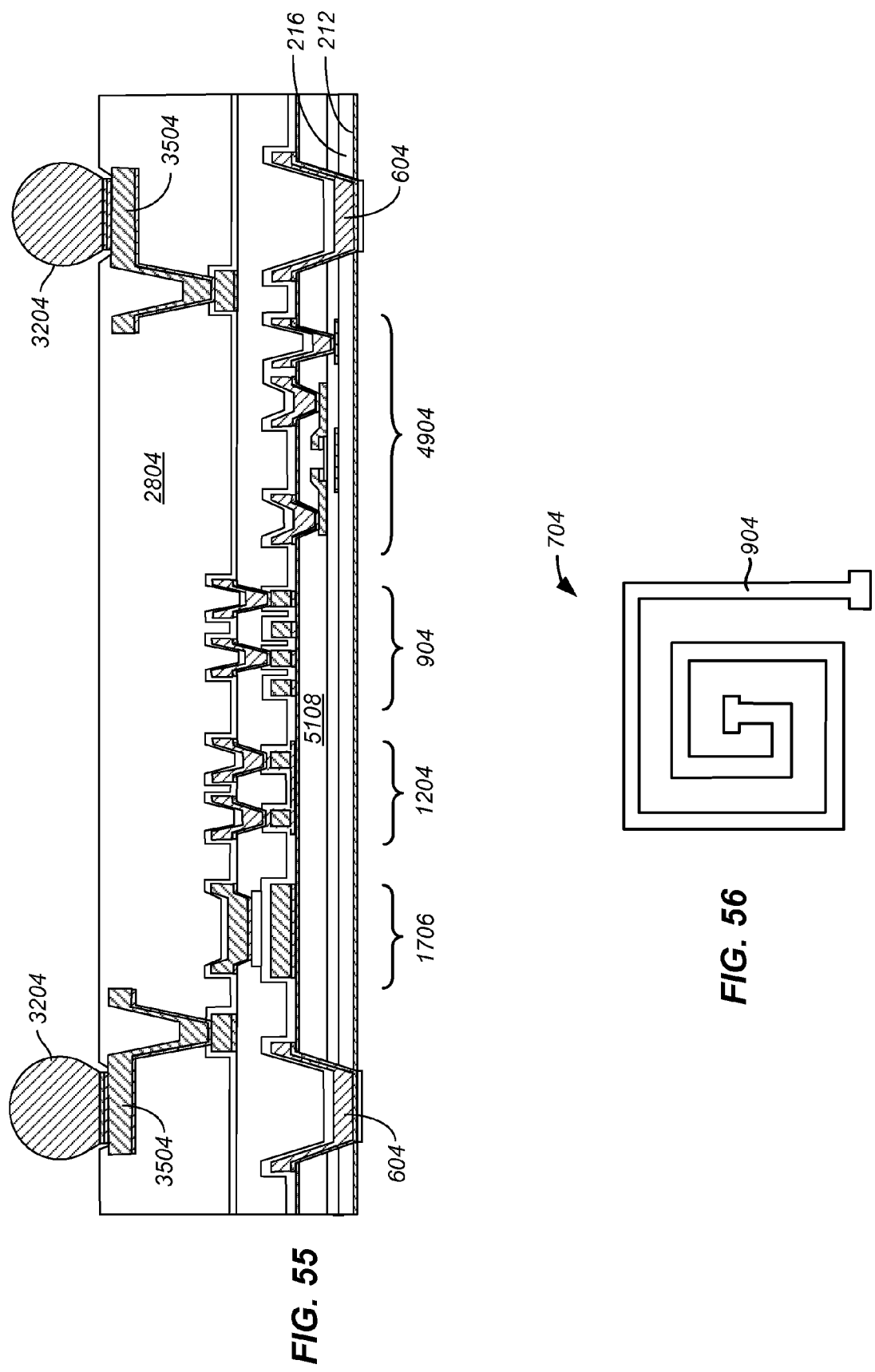

FLEXIBLE INTEGRATED CIRCUIT DEVICE LAYERS AND PROCESSES

TECHNICAL FIELD

This disclosure relates generally to integrated circuit (IC) devices and more specifically to IC device layers.

DESCRIPTION OF THE RELATED TECHNOLOGY

Integrated circuit (IC) devices are desirable for saving circuit board space. The integration density of such devices has been improved by stacking layers of IC devices. For instance, an IC device can be formed on a substrate and mounted on a printed circuit board (PCB). Several of these PCB-mounted IC devices can then be stacked. Conventional stacking techniques often require through-holes to be formed in the stacked IC layers and, thus, through the PCB and substrate of each layer to connect the layers to one another. For instance, pins can be inserted through the holes to connect the IC layers. The use of through-holes, however, is difficult due to coefficient of thermal expansion (CTE) mismatch among the layers, particularly between the substrates and the PCBs, in an integrated device. This is often because the substrates and circuit boards are made of different materials. CTE mismatch among stacked IC layers can result in device de-bonding issues.

SUMMARY

The systems, devices, and processes of the disclosure each have several innovative aspects, no single one of which is solely responsible for the desirable attributes disclosed herein.

Disclosed are implementations of devices and processes incorporating techniques for fabricating flexible integrated circuit (IC) device layers.

According to one innovative aspect of the subject matter described in this disclosure, a sacrificial layer is deposited on a substrate. In some examples, the sacrificial layer includes amorphous silicon or molybdenum. One or more electronic components are formed on the sacrificial layer. A polymer coating is provided on the one or more electronic components to define a coated device layer. The sacrificial layer is removed to release the coated device layer from the substrate. A dielectric layer can be deposited on the sacrificial layer. A xenon difluoride gas can be used to remove the sacrificial layer. Alternatively, the sacrificial layer can be etched. Coated device layers made in accordance with this process can be stacked, in some implementations.

In one example, the substrate can be formed of glass and have a thickness greater than or equal to about 0.2 millimeters. In another example, the substrate can be formed of silicon and have a thickness greater than or equal to about 0.1 millimeters. In other examples, the substrate can be formed of a plastic, a ceramic, a compound semiconductor, and/or a metal.

The electronic component(s) can include a passive component such as a resistor, an inductor, or a capacitor. The electronic component(s) can also or alternatively include an active component such as a transistor.

According to another innovative aspect of the subject matter described in this disclosure, a device includes a first coated device layer and a second coated device layer. The first coated device layer includes one or more first electronic components and a first polymer coating on the one or more first electronic components. The second coated device layer includes one or more second electronic components and a second polymer coating on the one or more second electronic components. The first coated device layer is disposed over the second coated device layer, and the one or more first electronic components are in communication with the one or more second electronic components. The first coated device layer and the second coated device layer do not include a substrate. In some examples, the first coated device layer is spaced apart from the second coated device layer.

In some examples, the device can further include a display, a processor, and a memory device. The processor is configured to communicate with the display and is configured to process image data. The memory device is configured to communicate with the processor. The device can further include a driver circuit configured to send a signal to the display. A controller can be configured to send at least a portion of the image data to the driver circuit. An image source module can be configured to send the image data to the processor. An input device can be configured to receive input data and to communicate the input data to the processor.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The included drawings are for illustrative purposes and serve only to provide examples of possible structures and techniques for the disclosed systems, apparatus, and processes for forming flexible integrated circuit (IC) device layers.

FIGS. 5-9 show examples of cross-sections of device fabrication stages in accordance with a process for forming an IC device, for instance, as represented in FIGS. 1A, 1B, and blocks 1036-1052 of the process illustrated in FIG. 1C.

FIG. 55 shows an example of a cross-section of a device fabricated in accordance with one or more processes for forming an IC device, for instance, as represented in FIGS. 1A-1C and FIG. 43.

FIG. 56 shows an example of a top-down schematic illustrating an inductor fabricated in accordance with one or more processes for forming an IC device, for instance, as represented in FIGS. 1A-1C.

Like reference numbers and designations in the various drawings indicate like elements.

DETAILED DESCRIPTION

Figure 1A:
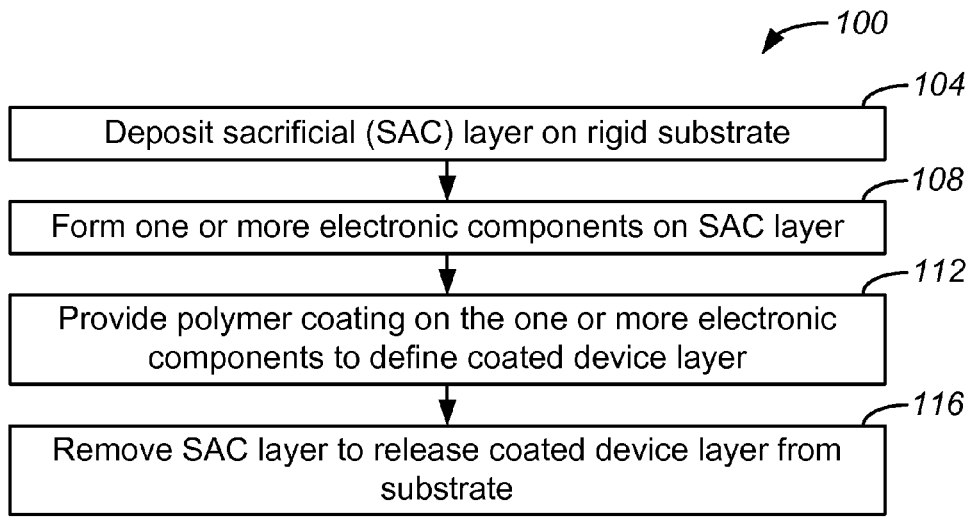
FIG. 1A shows an example of a flow diagram illustrating a process for forming an IC device, performed in accordance with one implementation.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, packaging (e.g., MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the Figures, but instead have wide applicability as will be readily apparent to one having ordinary skill in the art.

Disclosed are implementations of devices and processes implementing and using techniques for fabricating flexible integrated circuit (IC) device layers.

Implementations described herein provide for depositing a sacrificial (SAC) layer such as amorphous silicon (a-Si) on a rigid substrate as part of a process to form an IC device. An IC device layer including electronic circuit components is formed on the SAC layer, such that the SAC layer is disposed between the circuit layer and the rigid substrate. The SAC layer is then removed to release the IC device layer from the substrate. In one implementation, a gas such as xenon difluoride (XeF2) is introduced to remove the SAC layer. The device layer can then be lifted off of the substrate without damage to the device layer and the circuit components therein. There is generally no coefficient of thermal expansion (CTE) mismatch problem between the device layer and the rigid substrate since the substrate is removed. Also, because there is no remaining substrate, dielectric loss can be reduced.

In some implementations, a thick polymer coating is applied on top of the electronic components in the device layer. The thick polymer and an additional thin dielectric film can be provided in the device layer to protect the circuit components. The thick polymer provides rigidity to the device layer, in place of the rigid substrate, while allowing the device layer to have a degree of flexibility. Several IC device layers formed in this manner can be stacked for high-density integration without having to use through-holes. When coated device layers are to be stacked, solder balls can be situated between the layers and coupled to contact pads formed on the device layers to connect the device layers. Due to the thick polymer coating on each layer, the stacked IC device maintains a balance of rigidity and flexibility.

Particular implementations of the subject matter described in this disclosure can be implemented to realize one or more potential advantages. For example, in one implementation, the rigid substrate is formed of glass. Forming many IC device layers on one large glass substrate can result in significant cost savings in the manufacturing process. Glass panels are much less expensive than Si wafers. More devices can be fabricated on a large-area glass substrate than using conventional wafer technology. Also, extrusion coating techniques, such as those used to manufacture flat panel displays (FPD), can be implemented to coat the thick polymer layer over the large-area substrate without major material loss. The polymer material can be expensive; thus, minimizing the coating loss is desirable. This can be achieved with the disclosed device fabrication techniques, which provide for low risk and high volume production. Otherwise, the disclosed processes and structures generally provide for finer and more precise device fabrication than conventional PCB stacking or direct fabrication on a flexible substrate.

One or more electronic components can be formed in an IC device layer using etching and photoresist techniques, as described in greater detail below. In some implementations, passive electronic components in the form of resistors, inductors, and capacitors are formed. Active electronic components such as transistors and operational amplifiers ("op-amps") can also be fabricated as part of a device layer as disclosed herein.

While the present application is described with reference to a few specific implementations, the description and specific implementations are merely illustrative and are not to be construed as limiting. Various modifications can be made to the described implementations without departing from the true spirit and scope as defined by the appended claims. For example, the blocks of processes shown and described herein are not necessarily performed in the order indicated. It should also be understood that the processes may include more or fewer blocks than are indicated. In some implementations, blocks described herein as separate blocks may be combined. Conversely, what may be described herein as a single block may be implemented in multiple blocks.

Similarly, device functionality may be apportioned by grouping or dividing tasks in any convenient fashion. For example, when blocks are described herein as being performed by a single device (e.g., by a single logic device), the blocks may alternatively be performed by multiple devices and vice versa. Moreover, the specific components, parameters, and numerical values described herein are provided merely by way of example and are in no way limiting. The drawings referenced herein are not necessarily drawn to scale.

FIG. 1A shows an example of a flow diagram illustrating a process for forming an electronic IC device, performed in accordance with one implementation. The process 100 of FIG. 1A is described with reference to FIGS. 2-42 and 44-56, showing IC devices at different stages of fabrication. FIGS. 2-42 and 44-56 represent examples of fabricated structures, and FIG. 1A is not intended to be limited to these examples. One or more of the fabrication stages represented in these FIGS. may be omitted from process 100. Also, fabrication stages illustrated in these FIGS. can be performed in different sequences when performing the process of FIG. 1A.

In FIG. 1A, in block 104, a SAC layer 208 is deposited on a rigid substrate 204. In block 108, one or more electronic components can be formed on SAC layer 208. Such electronic components can include passive and/or active components, as described below. In block 112, a polymer coating, for instance, as described below, is provided on the one or more electronic components to define a coated device layer. In block 116, SAC layer 208 is removed to release the coated device layer from substrate 204.

Figure 1B:
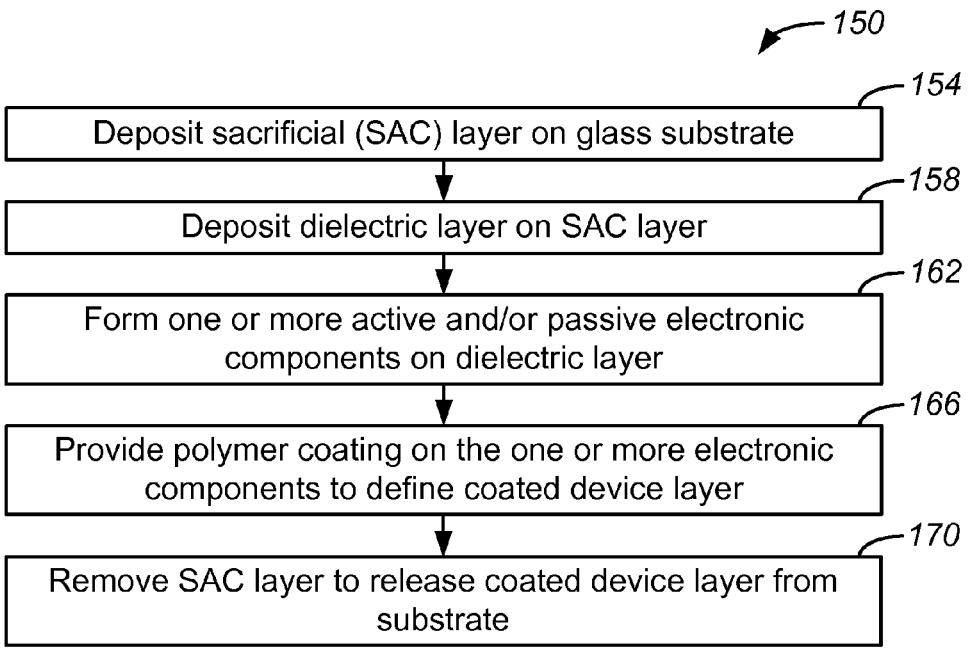
FIG. 1B shows an example of a flow diagram illustrating a process for forming an IC device, performed in accordance with another implementation.

FIG. 1B shows an example of a flow diagram illustrating a process for forming an IC device, performed in accordance with another implementation. The process 150 of FIG. 1B is described with reference to FIGS. 2-42 and 44-56 and, as with FIG. 1A, FIG. 1B is not intended to be limited to these examples. One or more of the fabrication stages represented in these FIGS. may be omitted from process 150. Also, fabrication stages illustrated in these FIGS. can be performed in different sequences when performing the process of FIG. 1B.

In FIG. 1B, in block 154, a SAC layer 208 is deposited on a rigid substrate 204, such as glass. In block 158, a dielectric layer 216 is deposited on SAC layer 208. In block 162, one or more passive electronic components, such as an inductor, resistor, or capacitor, and/or one or more active electronic components, such as a transistor, can be formed on dielectric layer 216. In block 166, a polymer coating is provided on the one or more electronic components to define a coated device layer. In block 170, SAC layer 208 is removed to release the coated device layer from the substrate 204.

Figure 1C:
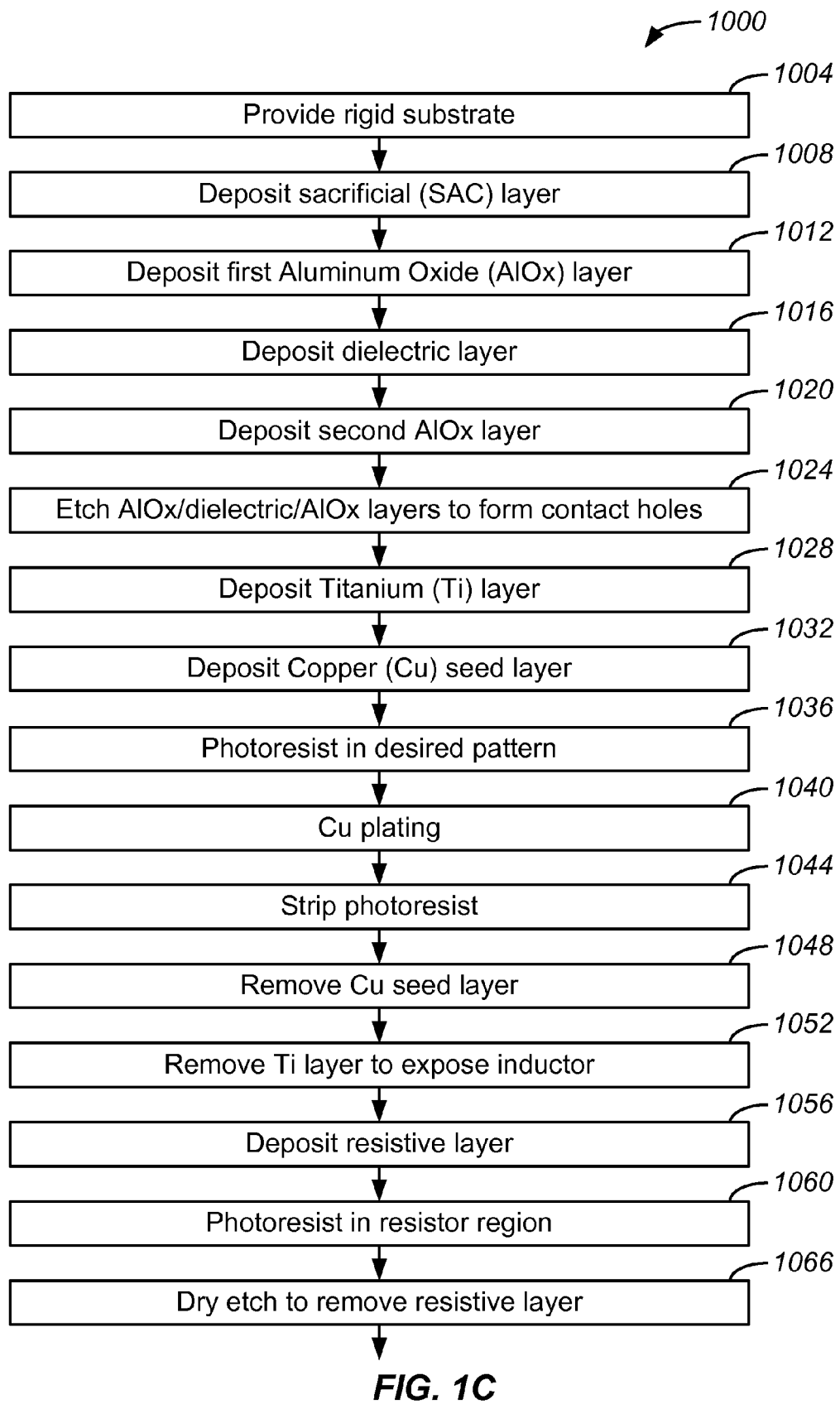
FIG. 1C shows an example of a flow diagram illustrating a process for forming an IC device including stacked, flexible, coated device layers, performed in accordance with one implementation.
Figure 1C:
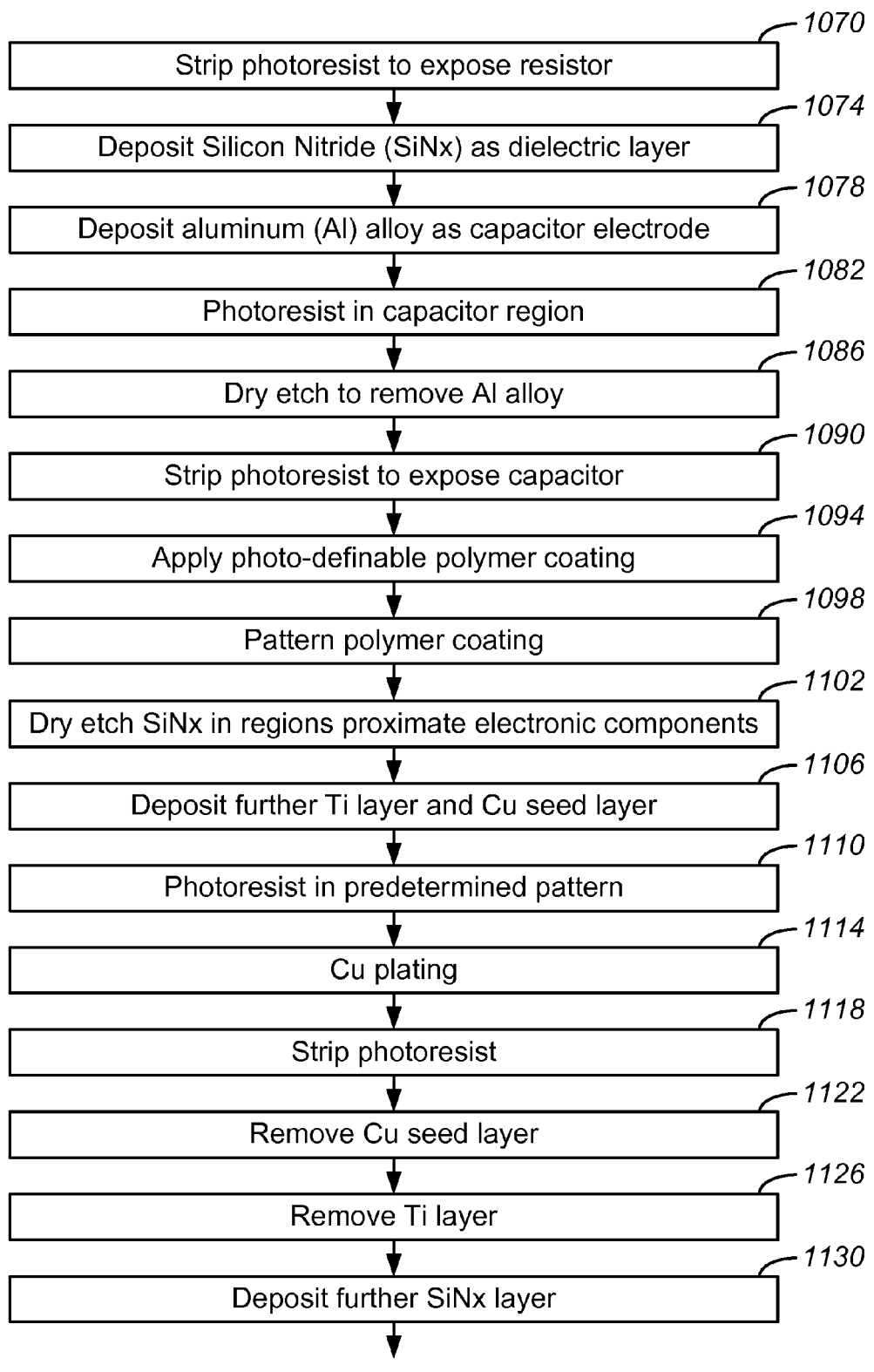
Figure 1C:
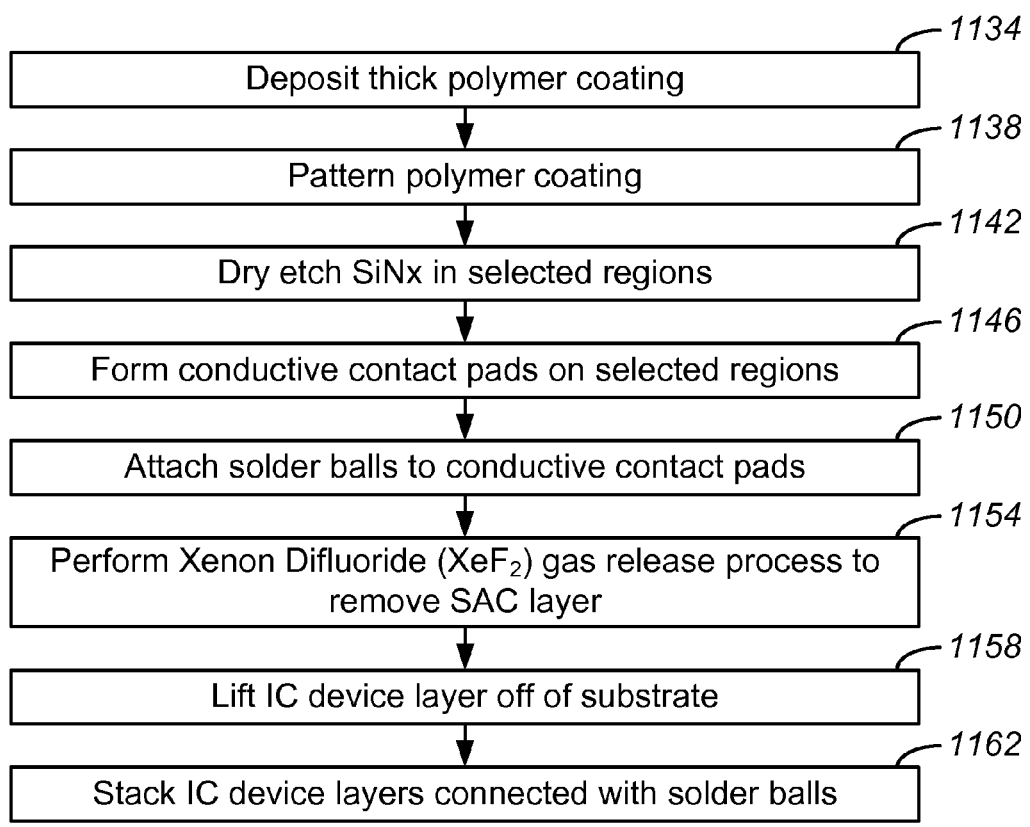

FIG. 1C shows an example of a flow diagram illustrating a process for forming an IC device including stacked, flexible, coated device layers, performed in accordance with one implementation. The process 1000 of FIG. 1C is described with reference to FIGS. 2-34, showing IC devices at different stages of fabrication.

Figure 2:
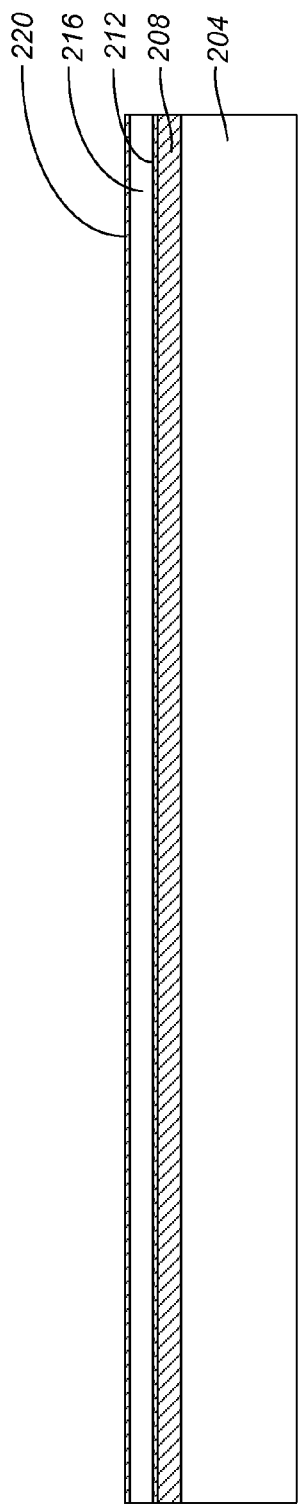
FIGS. 2-4 show examples of cross-sectional schematic illustrations of stages of device fabrication in accordance with a process for forming an IC device, for instance, as represented in FIGS. 1A, 1B, and blocks 1004-1032 of the process illustrated in FIG. 1C.
Figure 3:
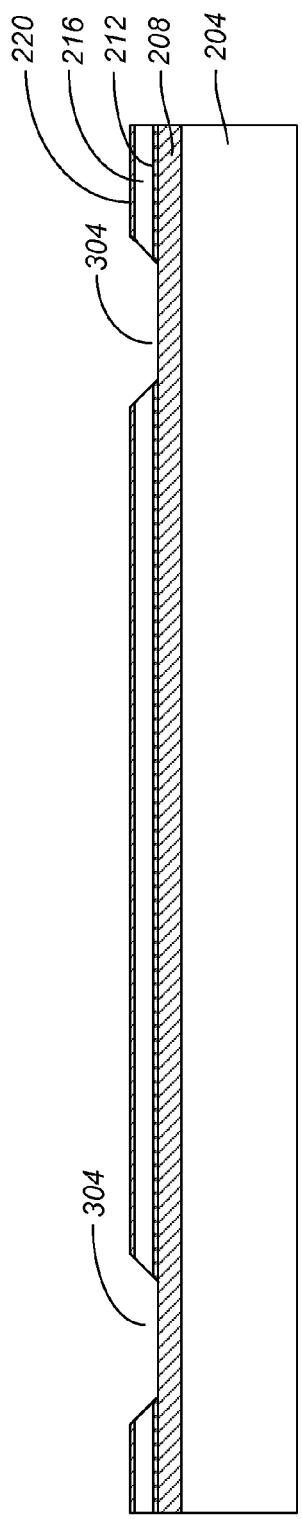
Figure 4:
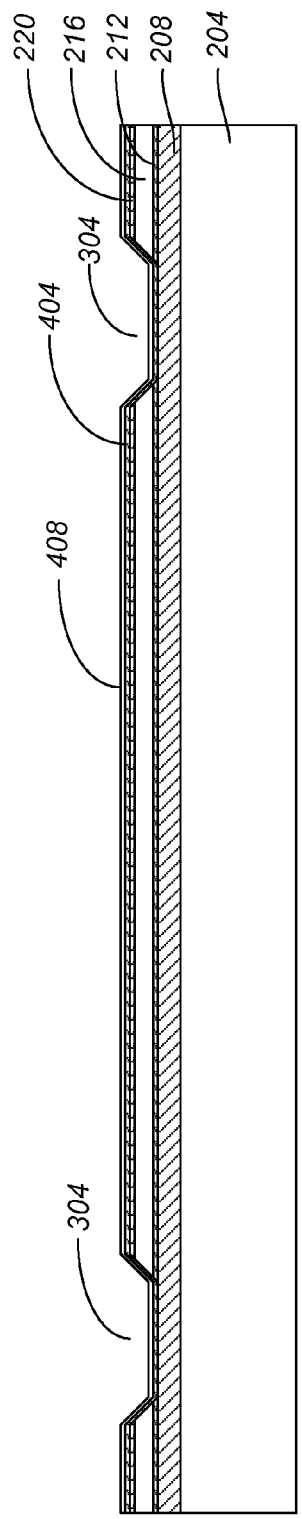

FIGS. 2-4 show examples of cross-sectional schematic illustrations of stages of device fabrication in accordance with a process for forming an IC device, for instance, as represented in FIGS. 1A, 1B, and blocks 1004-1032 of the process illustrated in FIG. 1C. In block 1004 of FIG. 1C, in one implementation, a substrate 204, for instance, formed of glass, is provided, as shown in FIG. 2. Glass is desirable because it is rigid and can have a larger surface area than other materials. The glass substrate can be formed of display grade glass, soda lime glass, among other examples. In some implementations, the glass substrate has a thickness greater than or equal to about 0.2 millimeters (mm), to provide the desired amount of rigidity. For instance, current FPD tools can handle glass with thicknesses greater than or equal to about 0.3 mm. In alternative implementations, other materials such as silicon, plastic, or metal can be used in place of or in addition to glass as the material for the rigid substrate. In some implementations, the glass substrate includes a coating such as $SiO_2$, $SiN_x$, and/or various metals. The substrate can also be formed of a ceramic, such as $AlO_x$, $YO_x$, $BN_x$, $SiC_x$, $AlN_x$, $GaN_x$, $BeO_x$, $TiO_x$, $ZrO_x$, $TiN_x$, $WC_x$, $TiC_x$, $SiN_x$, $AlO_xN_y$, $MgO_x$, $2MgO.SiO_2$, and/or $3Al_2O_3.SiO_2$. In other implementations, the substrate is formed of a compound semiconductor, such as GaAs, GaP, AlGaAs, AlAs, InP, InGaAsP, InAs, InSb, AlP, AlSb, GaSb, GaN, AN, SiC, ZnO, ZnS, ZnTe, CdS, CdSe, and/or CdTe. In further implementations, the rigid substrate is a Si wafer, for example, with a thickness greater than or equal to about 0.1 mm or 0.2 mm. One or more coatings such as $SiO_2$, $SiN_x$, and/or some metals can be applied to the Si wafer. In further implementations, metal substrates formed of various kinds of metals such as stainless steel, Al, Ti, Cr, Cu, W, Ni, V, Mo, Co, Ta, Fe, Pt, Au, Zn, Sn and/or alloys of such metals, for instance, AlCu, AlSi, AlCu, AlTi, AlSc, AlNd, AlCr, AlCo, AlTiSi, AlCuSi, AlSc, AlY, CrCu, CrMo, CrRu, CrTa, CrTi, CrV, CoNi, NiV, AlFe, NiFe, WSi, and WTi can be used. The various substrates described herein can be laminated, in some implementations.

In block 1008, a SAC layer 208 is deposited on the glass substrate. In one implementation, the SAC layer 208 includes amorphous silicon (a-Si). Other materials can be substituted for or combined with a-Si as the sacrificial layer, such as molybdenum (Mo). In one implementation, the SAC layer 208 is removable from the substrate 204 using a XeF2 release process, as further explained below.

In block 1012, in one implementation, a first aluminum oxide (AlOx) layer 212 is deposited on the SAC layer 208. This is followed in block 1016 by deposition of a dielectric layer 216, such as silicon dioxide (SiO2), on the AlOx layer 212. Deposition of the first AlOx layer 212 is optional, as its purpose is primarily to protect the dielectric layer 216 when the SAC layer 208 is removed. In one implementation, the dielectric layer 216 is thick enough that it can protect the device from environmental conditions, for instance, on the order of 1000 Angstroms. A range of thicknesses of dielectric layer 216 can be used in various implementations, for instance, in the range of 1000 Angstroms to several microns. However, the dielectric layer 216 is thin enough to facilitate some flexibility when the device is removed from the substrate 204.

In alternative implementations, silicon nitride (SiNx) or silicon oxynitride (SiON) are used in place of SiO2 for the dielectric layer 216. In some applications, such as those involving high frequencies, SiO2 can be a desirable material because SiO2 has a relatively low dielectric constant when compared with other dielectric materials. In other alternative implementations, spin-on glass (SOG) or a polymer coating such as benzocyclobutene (BCB) or polyimide can be deposited as the dielectric layer 216. In block 1020, a second AlOx layer 220 is then deposited on the dielectric film 216.

In FIG. 3, the second AlOx layer 220, the dielectric layer 216, and the first AlOx layer 212 are etched, in one implementation, using a wet etch process such as buffered oxide etch (BOE), in block 1024. The etching is applied as illustrated in FIG. 3 to form contact holes 304 for coupling to the SAC layer 208.

In FIG. 4, a titanium (Ti) layer 404 is then deposited as an adhesion layer over the second AlOx layer 220 and the contact holes 304, in block 1028. In one implementation, the Ti layer 404 has a thickness in the range of 100-300 Angstroms, although other thicknesses are contemplated. In block 1032, a copper (Cu) seed layer 408 is then deposited over the Ti layer 404. The Cu seed layer 408 is also thin, for instance, on the order of about 1000 Angstroms. The Ti and Cu layers serve as diffusion barriers, also collectively referred to herein as a "diffusion barrier," for the device. Other materials can be used in addition to or in place of Ti as a diffusion barrier, such as titanium nitride (TiN). In some applications, Cu is undesirable as a diffusion barrier. In such cases, the Cu seed layer 408 can be omitted, so only a Ti or TiN layer is deposited in FIG. 4.

FIGS. 5-9 show examples of cross-sections of device fabrication stages in accordance with a process for forming an IC device, for instance, as represented in FIGS. 1A, 1B, and blocks 1036-1052 of the process illustrated in FIG. 1C. In block 1036 of FIG. 1C, photoresist 504 is then deposited in a desired pattern, for example, as illustrated in FIG. 5. In block 1040, Cu plating is then applied to deposit a thick Cu layer 604 as a conductor on the diffusion barrier between the photoresist elements 504, as illustrated in FIG. 6. The Cu layer 604 is referred to herein as "thick," because it is relatively thick when compared with the Cu seed layer 408. For instance, the Cu layer 604 can be on the order of several microns in thickness.

In FIG. 7, following deposition of the Cu layer 604, the photoresist 504 is stripped, in block 1044. One of the patterns of Cu layer 604 provided by the patterned photoresist is a coil in region 704 of the device. FIG. 7 shows a side view of the coil, which can be shaped to have a general spiral pattern when viewed from the top of the device. For example, FIG. 56 shows a top-down schematic illustrating an inductor fabricated in accordance with one or more processes for forming an IC device, for instance, defined by a coil formed in region 704.

Figure 8:
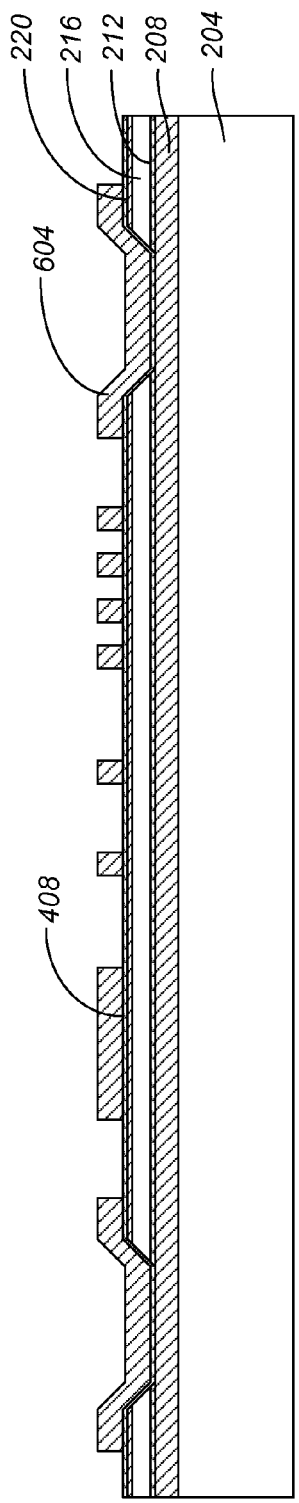
Figure 9:
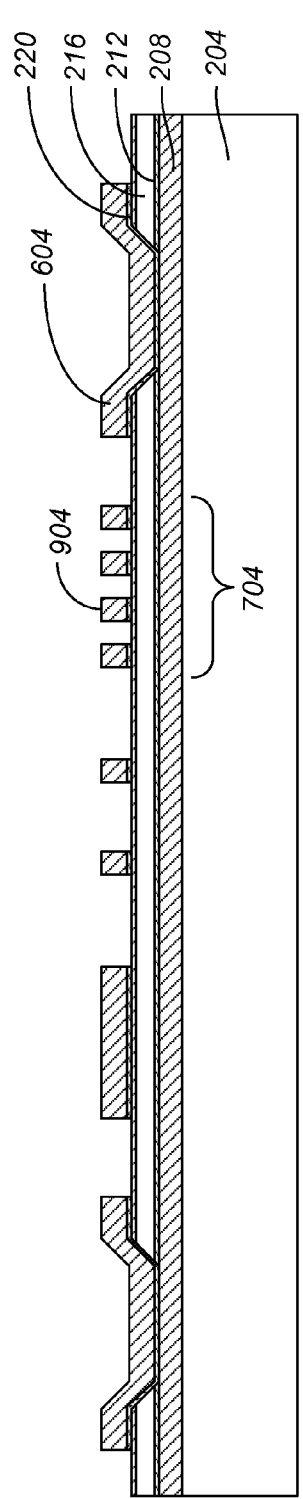

Then, in FIG. 8 and block 1048, the Cu seed layer 408 is removed, in one implementation, by wet etching. An example of a suitable wet etchant to remove the seed layer is 0.4 wt % (NH4)2S2O8. In FIG. 9 and block 1052, the Ti layer 404 is then removed, in one implementation, using a dry etch process. A suitable dry etchant to this end is a sulfur hexafluoride-oxygen gas (SF6/O2). The coil-shaped pattern of Cu plating in region 704 is thus left to define an inductor 904 as one component of the device.

Figure 10:
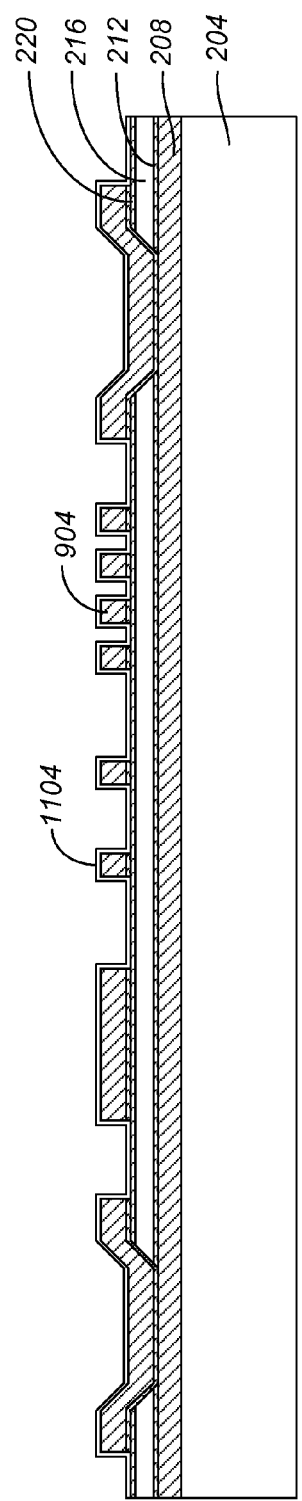
FIGS. 10-12 show examples of cross-sections of device fabrication stages in accordance with a process for forming an IC device, for instance, as represented in FIGS. 1A, 1B, and blocks 1056-1070 of the process illustrated in FIG. 1C.
Figure 11:
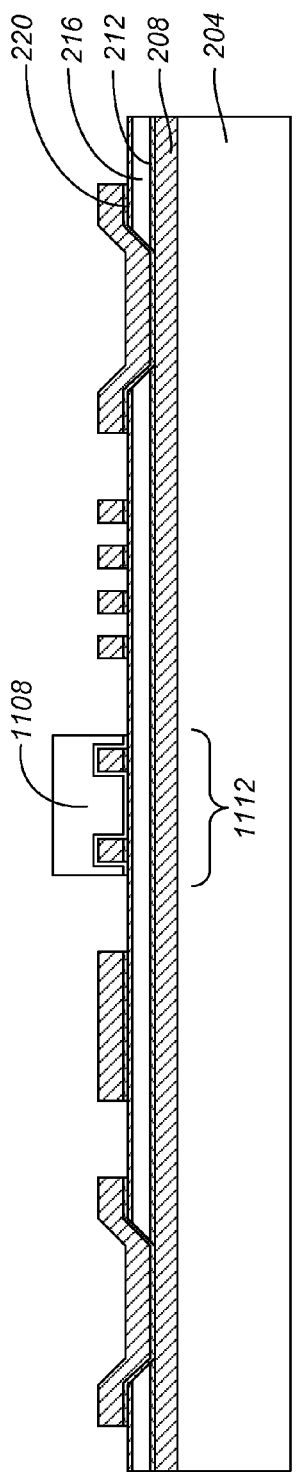
Figure 12:
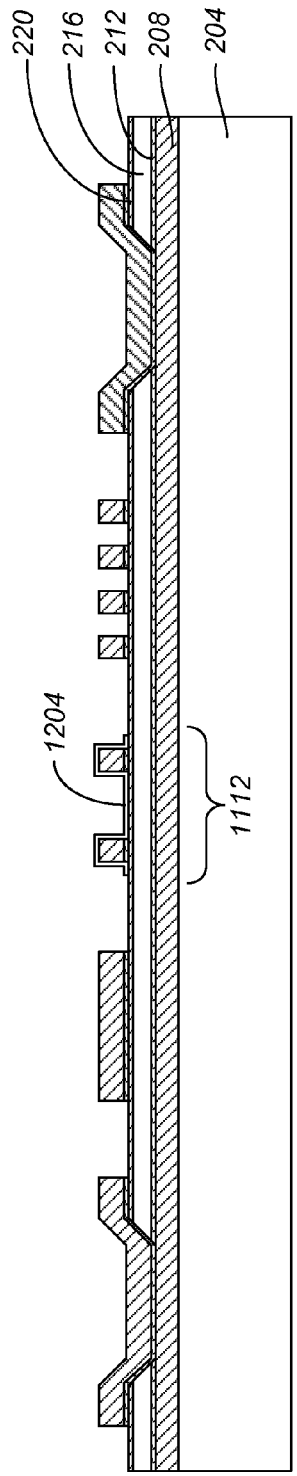

FIGS. 10-12 show examples of cross-sections of device fabrication stages in accordance with a process for forming an IC device, for instance, as represented in FIGS. 1A, 1B, and blocks 1056-1070 of the process illustrated in FIG. 1C. In FIG. 10, a tantalum nitride (TaNx) layer 1104 can be deposited on the Cu plating 604 and exposed portions of the second AlOx layer 220, in one implementation, to define one or more resistors on the device, in block 1056. TaNx can be a desirable resistive material in some environmental conditions in which temperature fluctuates, because the resistivity of the TaNx layer 1104 will remain generally stable. In FIG. 10, other resistive materials can be substituted for TaNx, depending on the desired implementation.

In FIG. 11, a photoresist 1108 is then applied in a region 1112 of the device in which a resistor is desired to be formed, in block 1060. When a dry etch is then applied to remove a substantial portion of the TaNx layer 1104 in block 1066, for instance, using SF6/O2, a portion of the TaNx remains in the region 1112 under the photoresist 1108. Then, in FIG. 12 and block 1070, the photoresist 1108 is stripped, exposing the TaNx portion 1204 as a resistor of the device.

Figure 13:
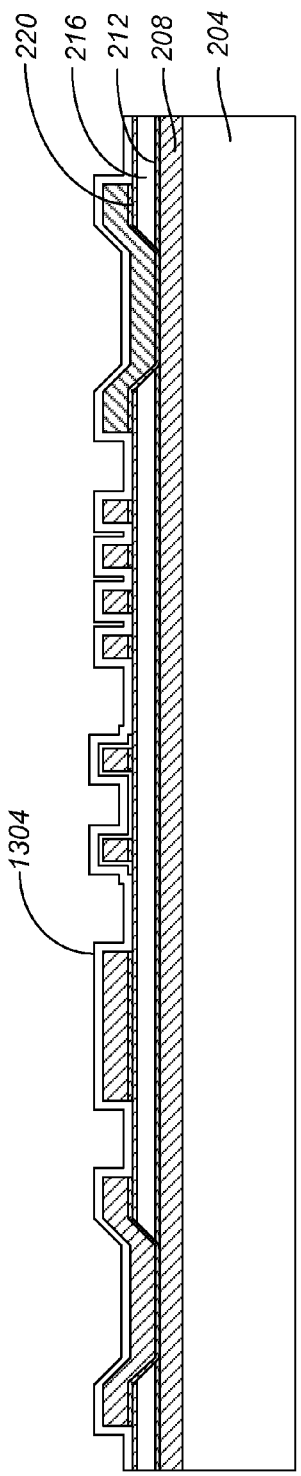
FIGS. 13-17 show examples of cross-sections of device fabrication stages in accordance with a process for forming an IC device, for instance, as represented in FIGS. 1A, 1B, and blocks 1074-1090 of the process illustrated in FIG. 1C.

FIGS. 13-17 show examples of cross-sections of device fabrication stages in accordance with a process for forming an IC device, for instance, as represented in FIGS. 1A, 1B, and blocks 1074-1090 of the process illustrated in FIG. 1C. In FIG. 13, the process of forming one or more capacitors on the device includes depositing silicon nitride (SiNx) as a dielectric layer 1304, in block 1074. The SiNx layer 1304 serves as a diffusion barrier to prevent migration of the Cu in layer 604, and also passivates the resistor 1204. In one implementation, the SiNx layer 1304 serves as a dielectric of the capacitor to be formed. In some medium-density capacitor implementations, SiNx is desirable because its dielectric constant can be controlled. In other implementations in which a low-density capacitor is desired, SiO2 can be used in place of SiNx for layer 1304. In high-density implementations, other materials such as AlOx, tantalum oxide (TaOx), and titanium oxide (TiOx) can be used.

Figure 14:
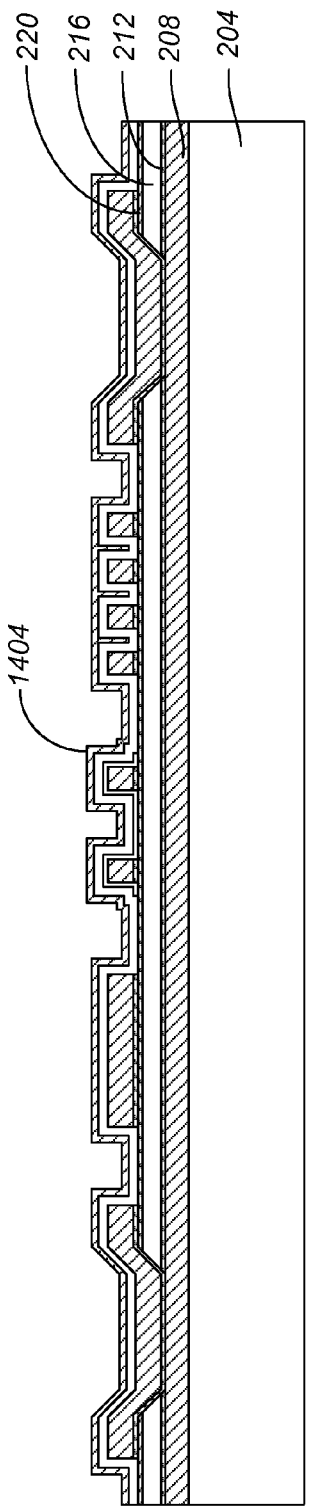
Figure 15:
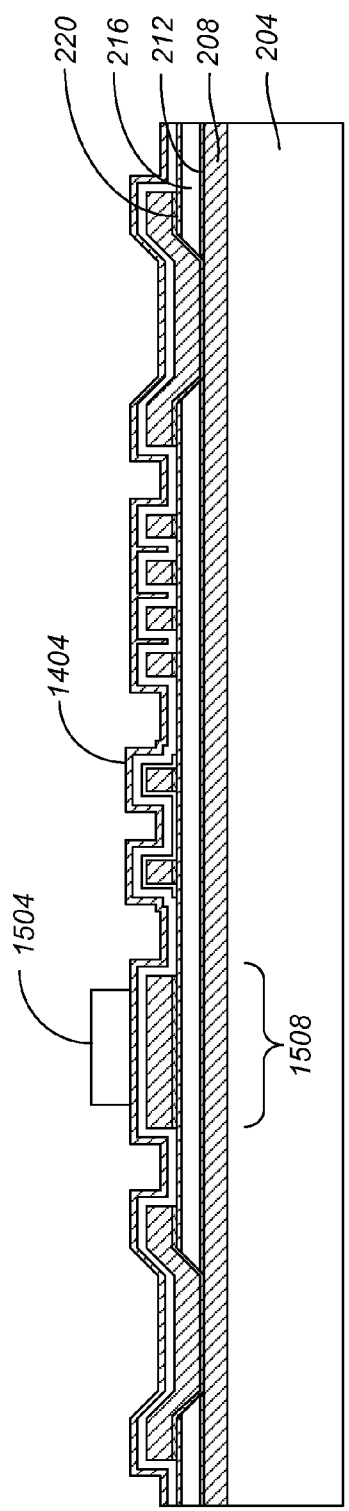
Figure 16:
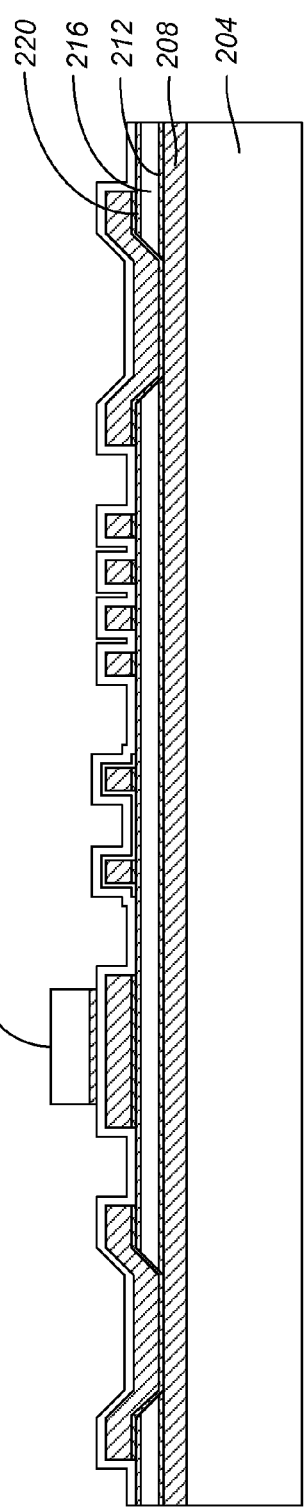
Figure 17:
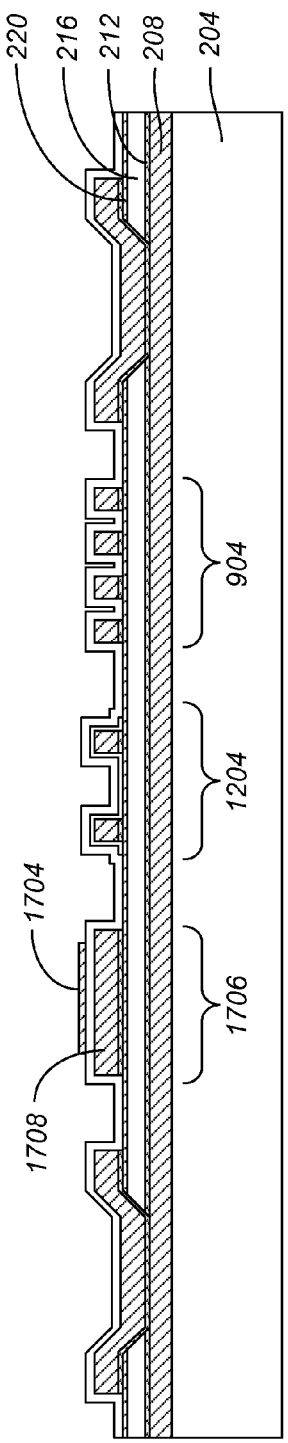

In FIG. 14, an aluminum (Al) alloy 1404 is deposited, in block 1078. In FIG. 15, a photoresist 1504 is applied over a desired region 1508 where the capacitor is to be located, in block 1082. In FIG. 16, dry etching the Al alloy 1404 leaves the SiNx layer 1304, in block 1086, and then stripping the photoresist 1504 in FIG. 17 and block 1090 leaves a portion of the Al alloy to serve as a first electrode 1704 of the capacitor 1706. A portion of the copper layer underneath the Al alloy portion serves as the second electrode 1708. In FIG. 16, a suitable dry etchant for removing the Al alloy 1404 is a chlorine-boron tricholoride gas (Cl2/BCl3).

Figure 18:
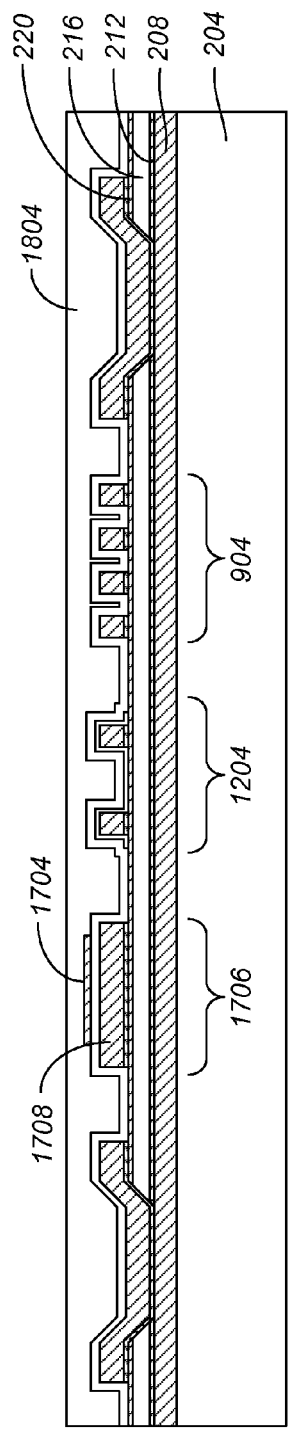
FIGS. 18-26 show examples of cross-sections of device fabrication stages in accordance with a process for forming an IC device, for instance, as represented in FIGS. 1A, 1B, and blocks 1094-1126 of the process illustrated in FIG. 1C.

FIGS. 18-26 show examples of cross-sections of device fabrication stages in accordance with a process for forming an IC device, for instance, as represented in FIGS. 1A, 1B, and blocks 1094-1126 of the process illustrated in FIG. 1C. In FIG. 18, a photo-definable polymer coating 1804 is applied, in block 1094. The polymer 1804 is sufficiently thick to isolate the above-described metal layers from one another and prevent parasitic coupling. An example of a suitable thickness of the polymer coating 1804 is about 10-20 microns. Examples of suitable polymer materials include BCB and any of the high density (HD) polymers made by DuPont, such as HD7000. The thick polymer coating 1804 can be applied using extrusion coating technology, such as that used for microelectronic and flat panel display (FPD) applications.

Figure 19:
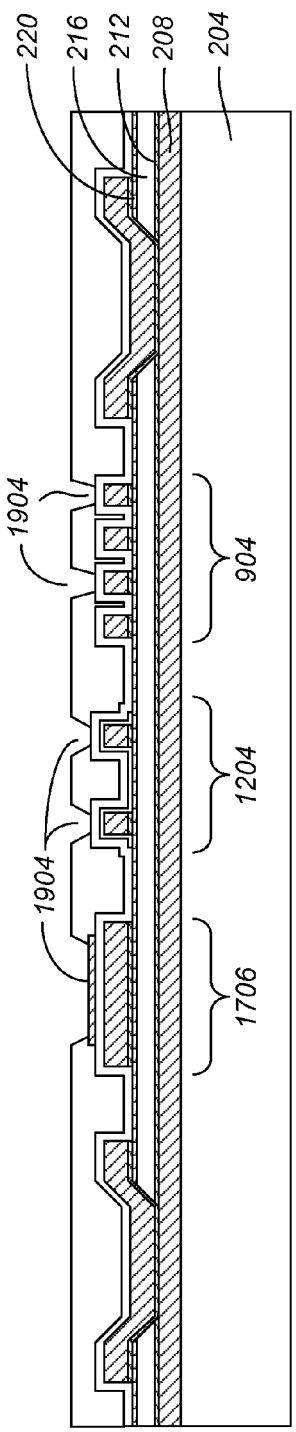
Figure 20:
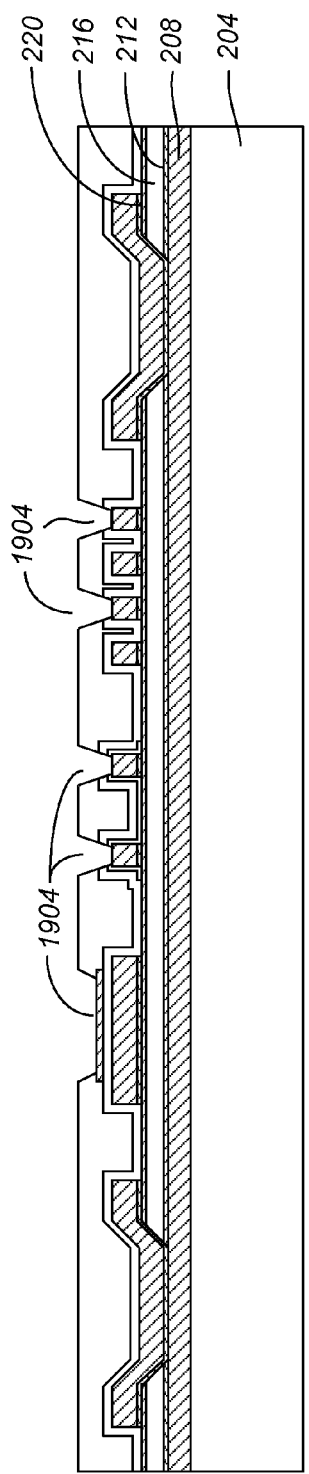
Figure 21:
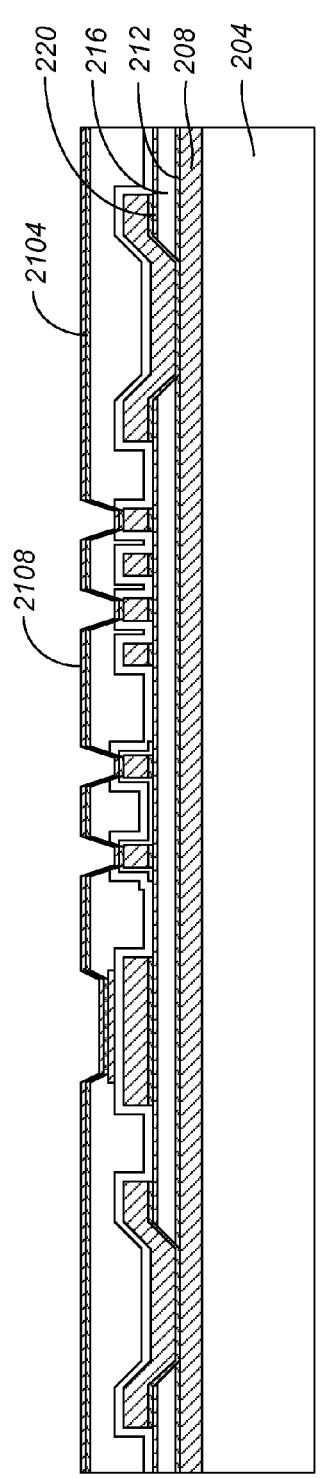

In FIG. 19, the polymer coating 1804 is patterned in block 1098, for instance, using an expose and develop process, and cured. In this way, selected areas 1904 proximate the electronic components, e.g., the capacitor, resistor, and inductor described above are exposed so that contacts to upper metal layers can be made. In FIG. 20, a dry etch is performed in block 1102 to remove portions of SiNx 1304 exposed in the selected areas 1904 proximate the resistor and inductor. The dry etch can be performed, for instance, using a SF6/O2 or a tetrafluoromethane-oxygen (CF4/O2) etchant. In FIG. 21, a further Ti layer 2104 and a Cu seed layer 2108 are deposited, in block 1106, in similar fashion as described above with reference to FIG. 4.

Figure 22:
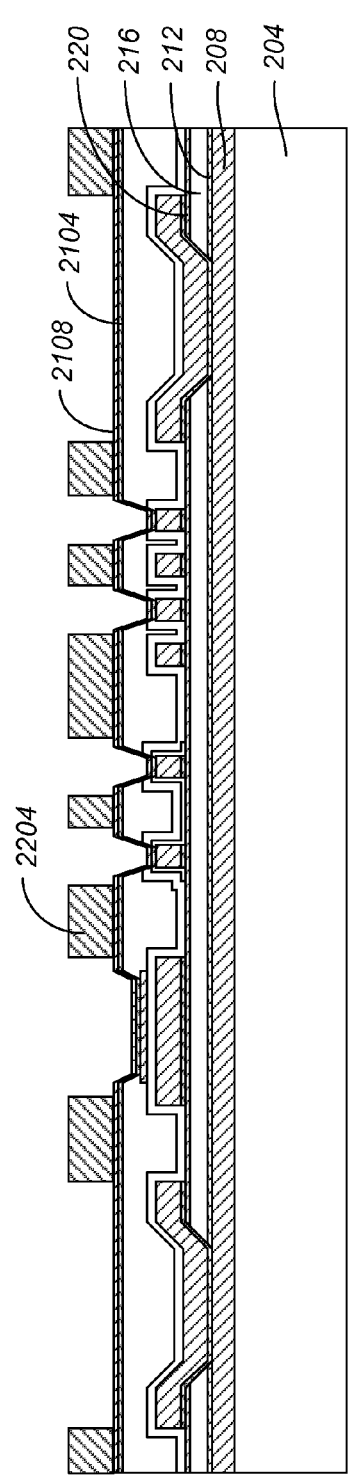
Figure 23:
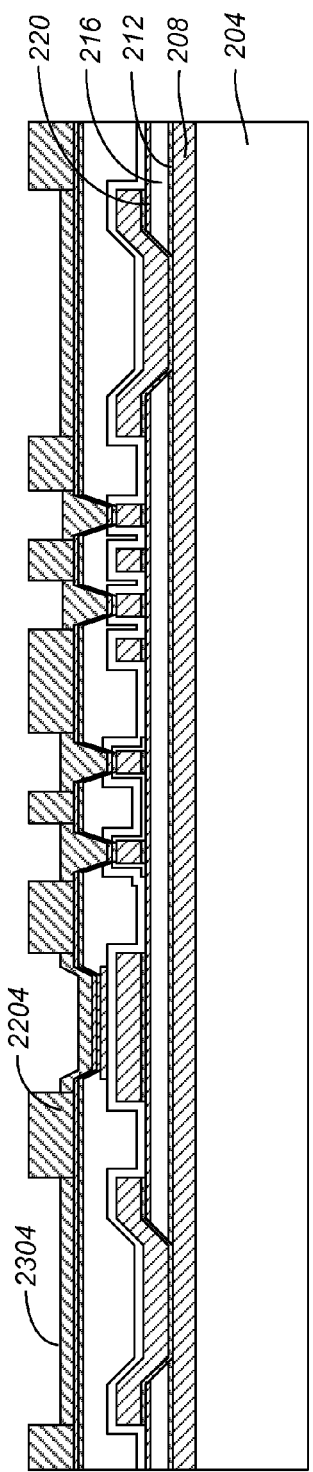
Figure 24:
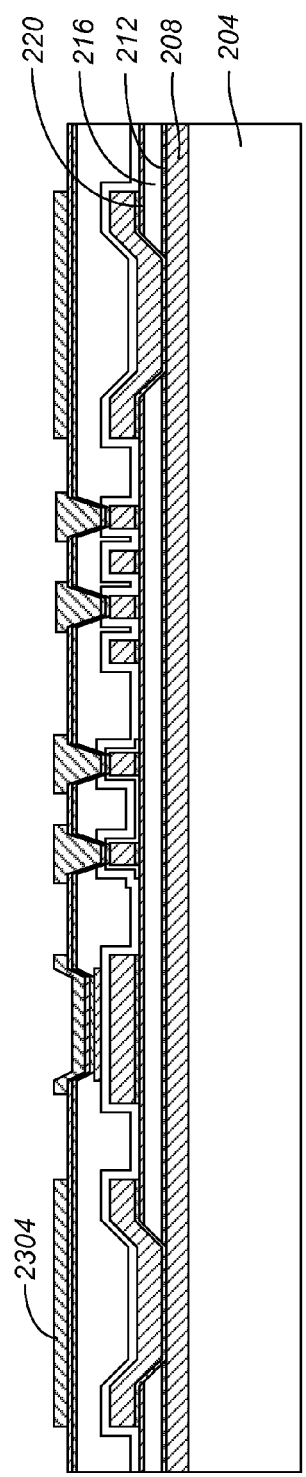
Figure 25:
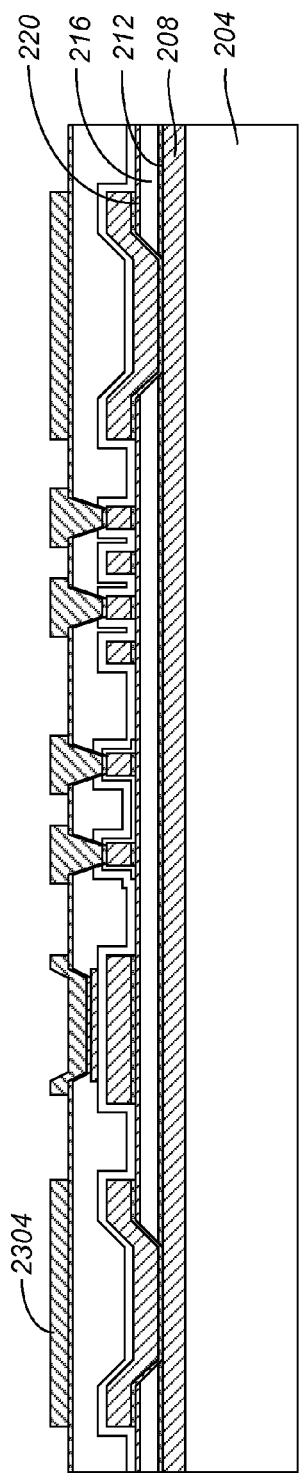
Figure 26:
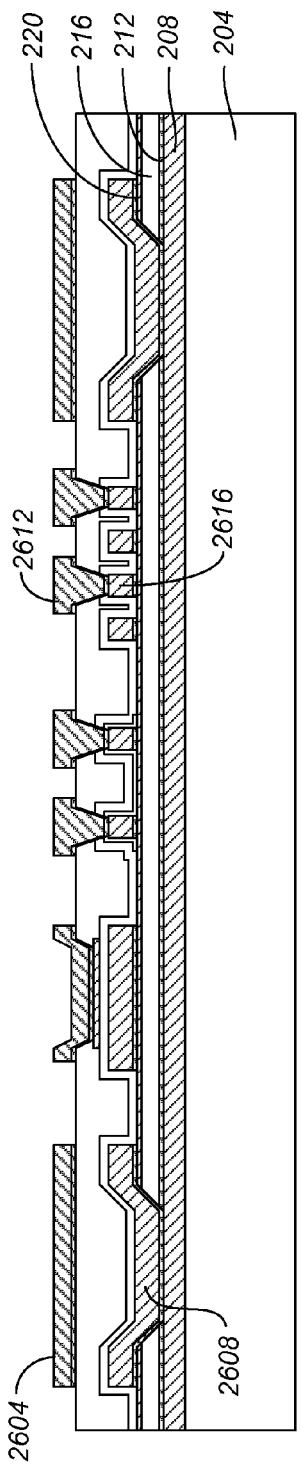

In block 1110, a further photoresist 2204 is applied, as illustrated in FIG. 22. The photoresist 2204 is patterned so that Cu can be grown in predetermined shapes in contact with the Cu seed layer 2108, particularly in exposed areas 1904 proximate the passive or active components of interest. In FIG. 23 and block 1114, a further layer of thick Cu plating 2304 is then deposited on the Cu seed layer 2108 between the photoresist elements 2204. In FIG. 24 and block 1118, the photoresist 2204 is stripped. In FIG. 25 and block 1122, the Cu seed layer 2108 is removed, as described above with reference to FIG. 8. In FIG. 26 and block 1126, the exposed portions of Ti layer 2104 are also removed, as described above with reference to FIG. 9. A diluted hydrofluoric (HF) acid can be used to remove the Ti layer.

In FIG. 26, the individual Cu plating elements 2304 provide metal contacts to one or more of the electronic components described above. In some implementations, The Cu plating elements 2304 define separate passive components. In addition, certain Cu plating elements 2304 can cooperate with underlying Cu plating elements 604 to define passive or active components. For instance, Cu plating element 2604 and Cu plating element 2608 can be used to define a low-density capacitor. In another example, Cu plating elements 2612 and 2616 cooperate to define a transformer. Thus, additional circuit components can be constructed using metal in layers 2304 and 604. Further metal and polymer layers can be deposited to define further circuit components, using the techniques described above.

Figure 27:
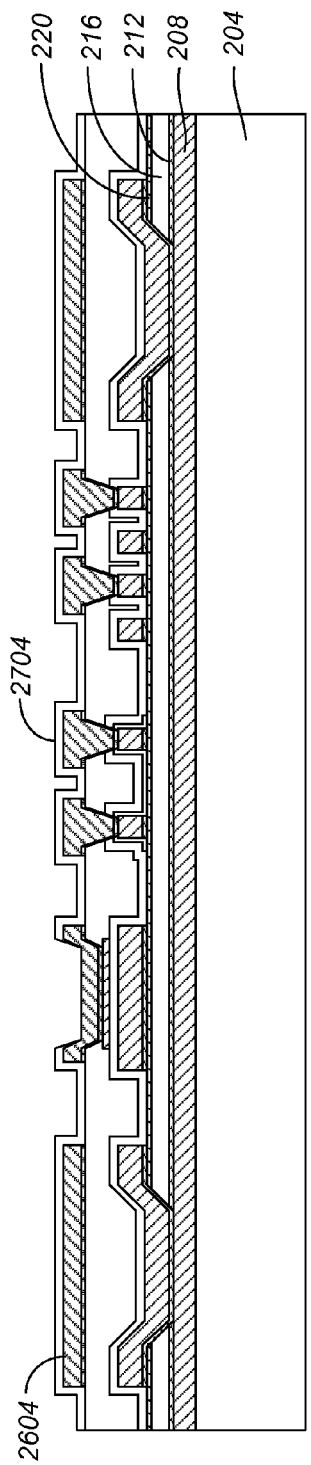
FIGS. 27-30 show examples of cross-sections of device fabrication stages in accordance with a process for forming an IC device, for instance, as represented in FIGS. 1A, 1B, and blocks 1130-1142 of the process illustrated in FIG. 1C.

FIGS. 27-30 show examples of cross-sections of device fabrication stages in accordance with a process for forming an IC device, for instance, as represented in FIGS. 1A, 1B, and blocks 1130-1142 of the process illustrated in FIG. 1C. In FIG. 27, a further SiNx layer 2704 is deposited in block 1130, as described above with reference to FIG. 13. The SiNx layer 2704 provides passivation and serves as a moisture barrier to the Cu plating layer 2304.

Figure 28:
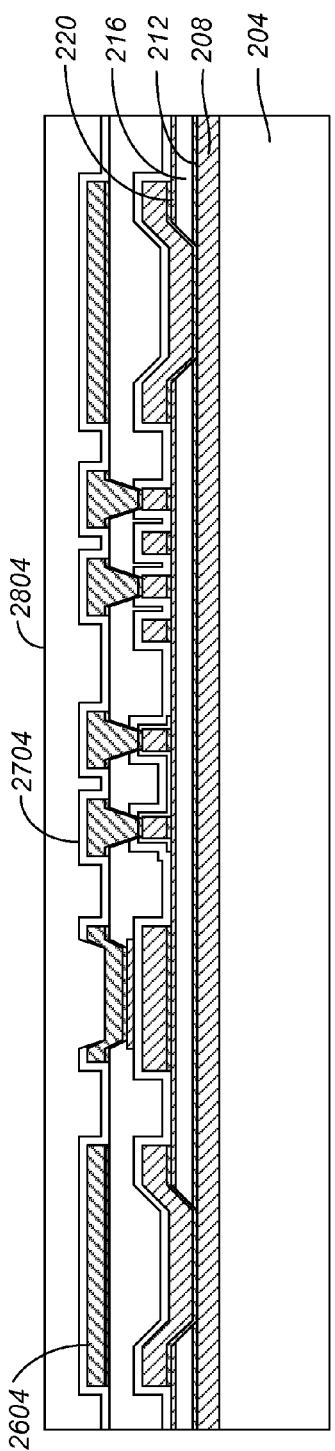

In FIG. 28, a further polymer coating 2804 is deposited, in block 1134. This polymer coating 2804 can be photo-definable or non-photo-definable, depending on the desired implementation. The polymer 2804 is sufficiently thick to provide a desired balance of an amount of rigidity and an amount of flexibility for the device when the glass substrate 204 is removed. In determining the desired rigidity and flexibility, the stacking of device layers described below can be taken into account. In one example, the polymer coating 2804 has a thickness in the range of about 50-200 microns, whereas the underlying polymer coating 1804 can be about 10-20 microns thick. In other examples, polymer coating 2804 is thicker, for example, in the range of about 200-300 microns. In one implementation, polymer coating 2804 is about 300 microns thick. Examples of suitable polymer materials for the polymer coating 2804 include BCB, HD7000, and CYTOP™ made by Asahi Glass, 1-12-1, Yurakucho, Chiyoda-ku, Tokyo 100-8405 Japan.

Figure 29:
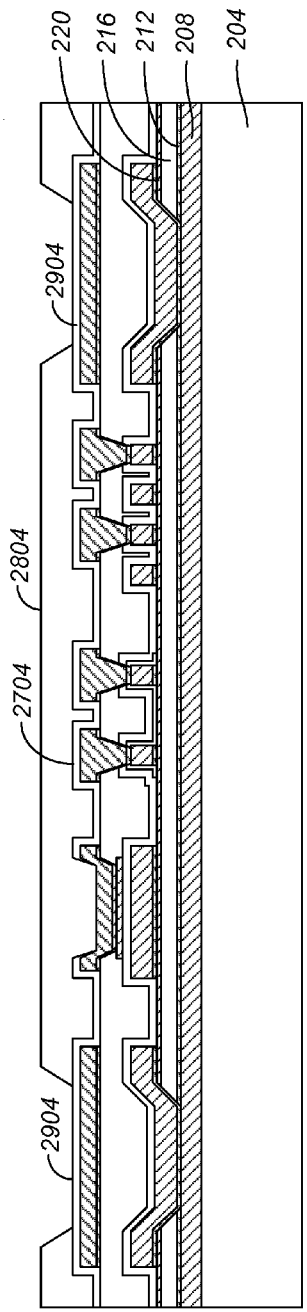
Figure 30:
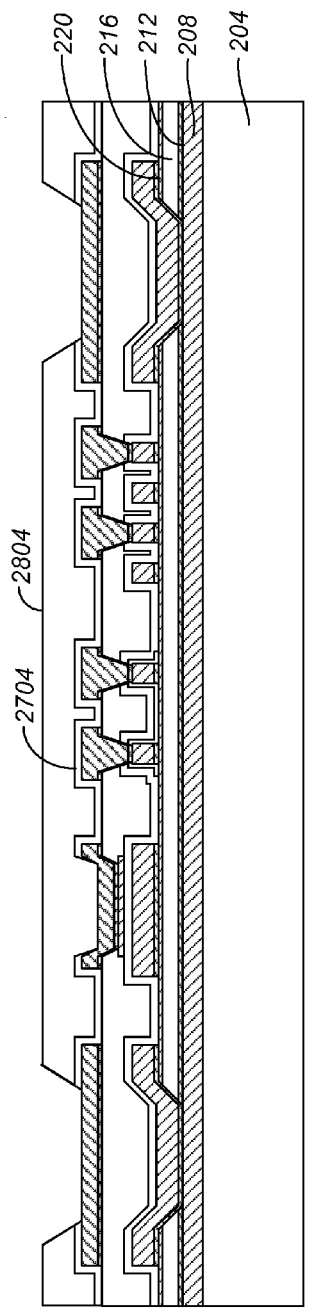

In FIG. 29, the polymer coating 2804 is patterned using any of a variety of techniques, in block 1138. For example, the polymer 2804 can be laser patterned or wet etched and cured. In FIG. 29, the polymer 2804 coating is patterned so SiNx areas 2904 proximate selected Cu plating elements are exposed. In FIG. 30 and block 1142, a dry etch is performed to remove portions of SiNx in the selected areas 2904 to expose the underlying Cu plating elements, as explained above with reference to FIG. 20.

Figure 31:
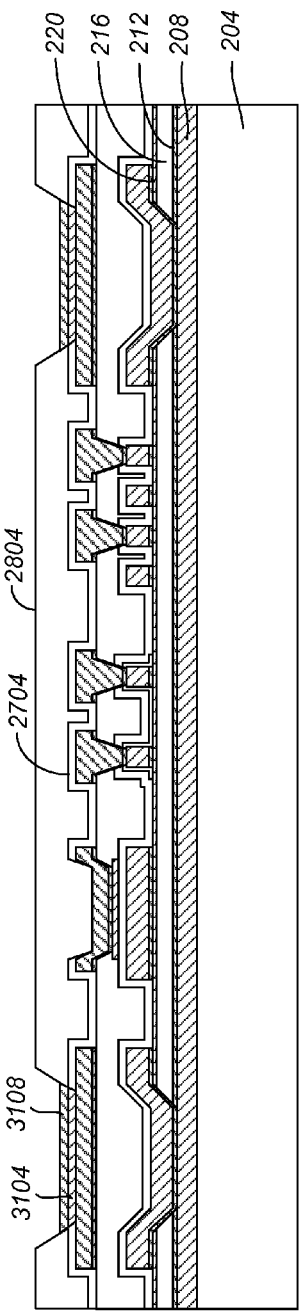
FIGS. 31 and 32 show examples of cross-sections of device fabrication stages in accordance with a process for forming an IC device, for instance, as represented in FIGS. 1A, 1B, and blocks 1146 and 1150 of the process illustrated in FIG. 1C.
Figure 32:
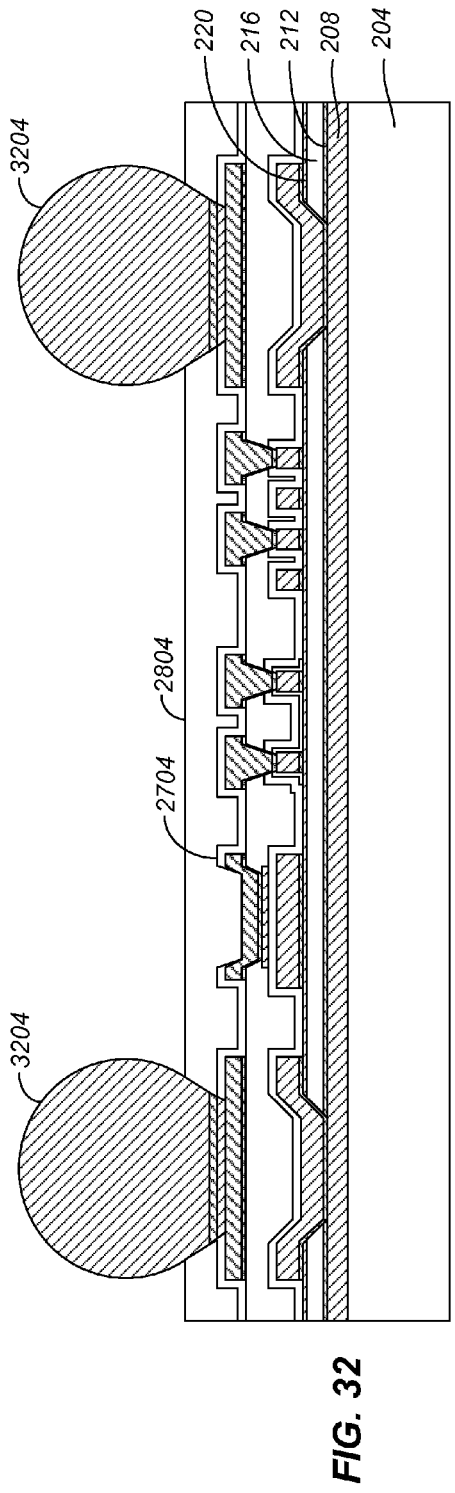

FIGS. 31 and 32 show examples of cross-sections of device fabrication stages in accordance with a process for forming an IC device, for instance, as represented in FIGS. 1A, 1B, and blocks 1146 and 1150 of the process illustrated in FIG. 1C. In FIG. 31 and block 1146, in one implementation, a nickel (Ni) layer 3104 and a gold (Au) plating layer 3108 are deposited in the selected areas 2904 to define conductive contact pads on the exposed Cu plating elements for external devices to be electrically coupled with the device. Additional conductive contact pads can be formed on the device.

In FIG. 32, solder balls 3204 are attached to the conductive contact pads in block 1150. The Au plating 3108 bonds with the solder, whereas the Ni layer 3104 serves as a barrier and adhesion layer to the underlying Cu plating elements. The solder balls 3204 provide connections for stacking the devices in layers, as further explained below.

Figure 33:
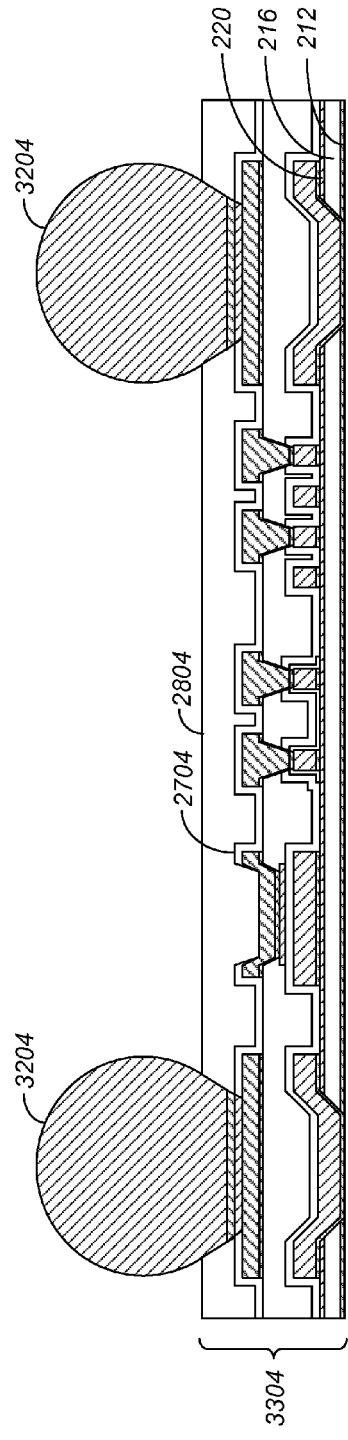
FIG. 33 shows an example of a cross-section of a device fabrication stage in accordance with a process for forming an IC device, for instance, as represented in FIGS. 1A, 1B, and blocks 1154 and 1158 of the process illustrated in FIG. 1C.

FIG. 33 shows an example of a cross-section of a device fabrication stage in accordance with a process for forming an IC device, for instance, as represented in FIGS. 1A, 1B, and blocks 1154 and 1158 of the process illustrated in FIG. 1C. In FIG. 33 and block 1154, a xenon difluoride (XeF2) gas is applied to the device to remove the SAC layer 208 and thereby release the remaining coated device layer 3304, also referred to herein as an IC layer or IC device layer, including the above-described passive and active components, from the substrate 204. In an alternative implementation, the SAC layer 208 is removed by etching, for instance, using a lateral etching process. When the SAC layer 208 is removed, the IC layer 3304 is essentially floating on the substrate 204 and can thus be lifted off of the substrate 204 in block 1158. Without the substrate, the remaining coated device layer 3304 has flexibility and some degree of rigidity provided by the thick polymer layer 2804.

Figure 34:
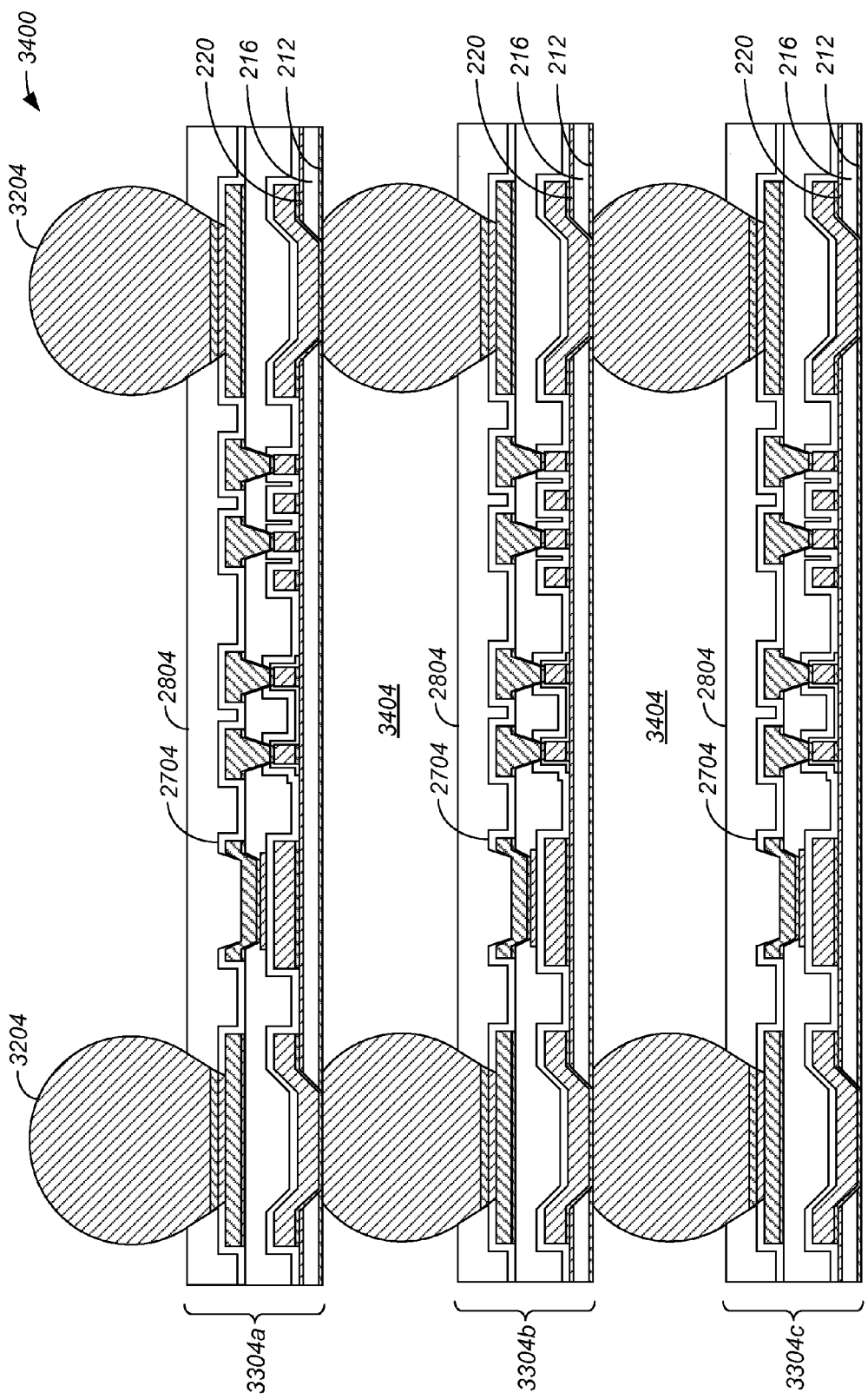
FIG. 34 shows an example of a cross-section of a device fabrication stage in accordance with a process for forming an IC device, for instance, as represented in block 1162 of the process illustrated in FIG. 1C.

FIG. 34 shows an example of a cross-section of a device fabrication stage in accordance with a process for forming an IC device, for instance, as represented in block 1162 of the process illustrated in FIG. 1C. In FIG. 34, a plurality of IC device layers 3304a-c can be stacked and coupled to one another via the solder balls, in block 1162, to define a stacked IC device 3400. In some implementations, the stacked device layers are spaced apart from one another. Air gaps 3404 are provided between the IC layers 3404a-c, by virtue of the width of the solder balls 3204. Such gaps can be desirable to facilitate airflow between the IC layers to cool the components contained therein. For instance, this can be helpful in high-power implementations, in which increased amounts of heat are generated on the IC layers 3304a-c. Examples of suitable widths of the gaps 3404 are on the order of several millimeters (mm). For example, gaps 3404 could have widths in the range of about 0.1 mm to 1.0 mm. Standardized solder ball sizes, e.g., on the order of 1 mm, can be selected to provide the desired gap widths between IC layers 3304*a-c*. Smaller solder balls than those used in conventional stacked devices, such as solder balls having widths of 0.1 mm, 0.2 mm, 0.3 mm, 0.5 mm, 0.7 mm and so forth up to about 1 mm, can be used with the stacked IC layers of FIG. 34, since the rigid substrates have been removed.

In an alternative implementation, following block 1142 of FIG. 1C, solder ball pads and a further thin polymer layer can be deposited, for instance, before performing the operations described above in blocks 1146-1162. Such can be desirable in implementations where the polymer coating 2804 is thicker, for example, in the range of about 300 microns, and a smaller solder ball as described above may be thinner than the thickness of polymer coating 2804.

Figure 35:
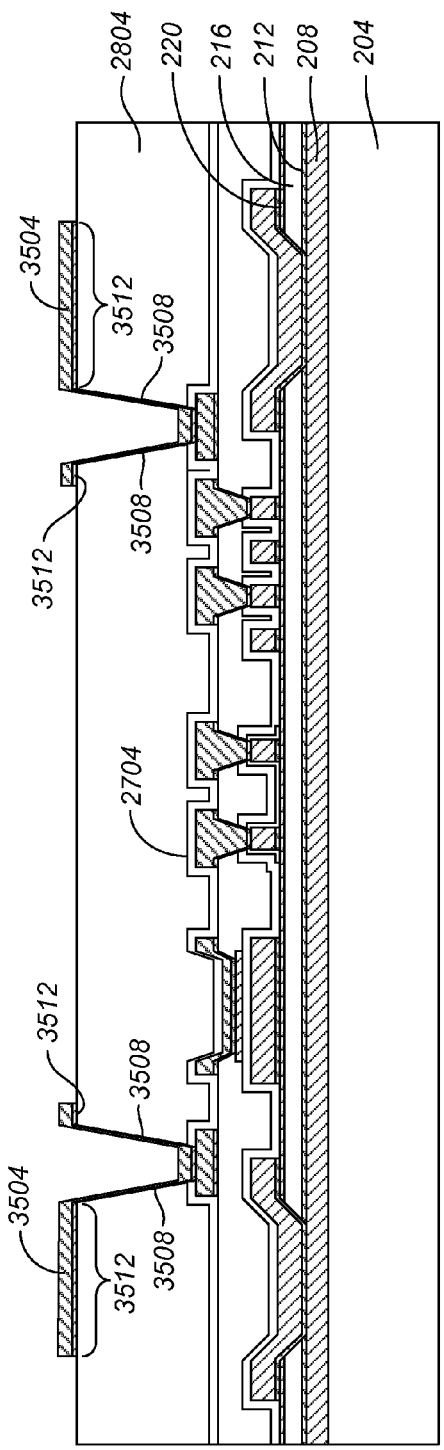
FIGS. 35-40 show examples of cross-sections of device fabrication stages in accordance with a process for forming an IC device, for instance, as represented in FIGS. 1A-C, including the formation of further conductive pads and a further thin polymer layer on a device layer.

FIGS. 35-40 show examples of cross-sections of device fabrication stages in accordance with a process for forming an IC device, for instance, as represented in FIGS. 1A-C, including the formation of further conductive pads and a further thin polymer layer on a device layer. In this alternative implementation, after portions of SiNx are removed in the selected areas 2904 in block 1142 to expose the underlying Cu plating elements, conductive pads 3504 can be formed over the selected areas, as shown in FIG. 35. For example, conductive pads 3504 can be deposited using Cu plating techniques described above. In one implementation, conductive pads 3504 cover selected areas 2904, as shown in FIG. 29, as well as exposed portions of polymer coating 2804 proximate selected areas 2904. For instance, in FIG. 35, sidewalls 3508 and edge regions 3512 of polymer coating 2804 can be covered by conductive pads 3504.

Figure 36:
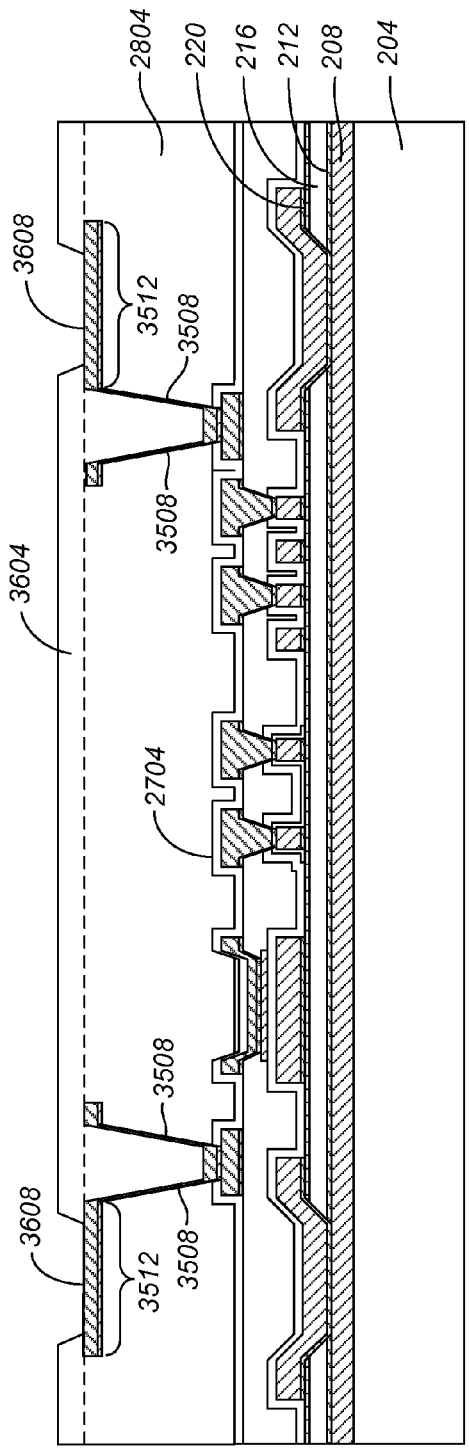

Continuing with this alternative implementation, in FIG. 36, a further thin photo-definable polymer coating 3604 can be deposited using techniques described above, for instance, with respect to FIG. 18 and block 1094. An example of a suitable thickness of polymer coating 3604 is in the range of about a few (e.g., 10) microns to about 50 microns. The polymer 3604 is then patterned, for instance, as described above with respect to FIG. 19 and block 1098, to expose selected areas 3608 of conductive pads 3504 overlaying polymer coating 2804. In this way, contacts to conductive pads 3504 can be made.

Figure 37:
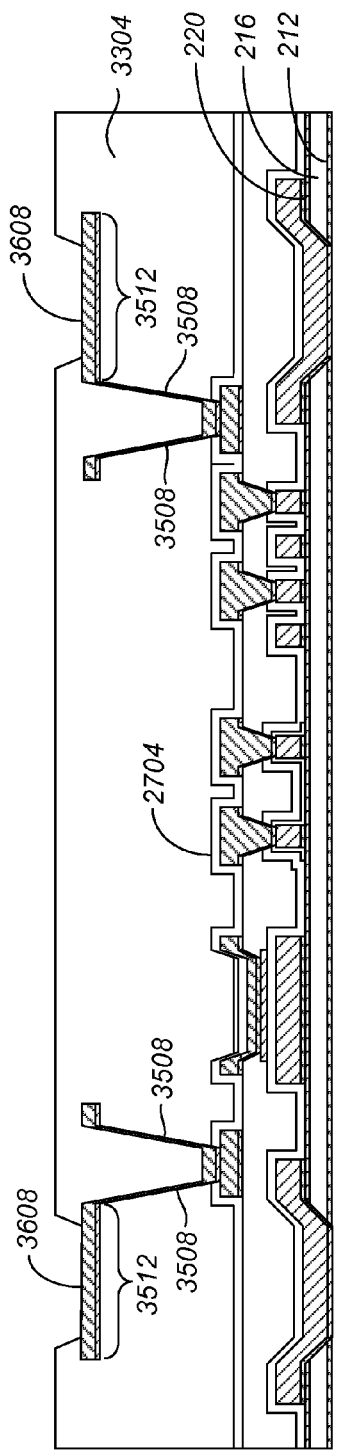
Figure 38:
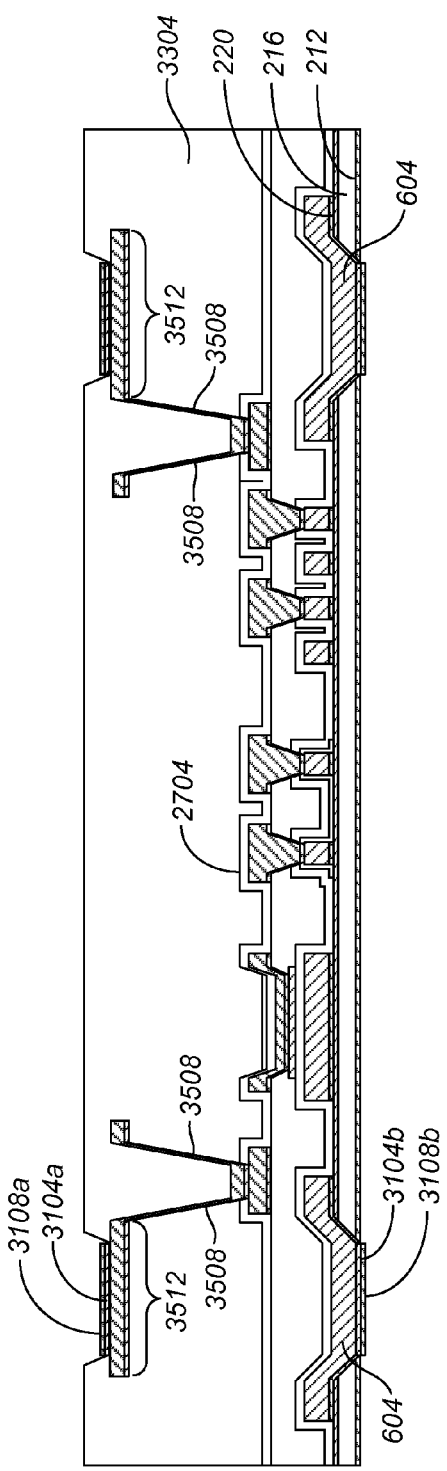

The removal of SAC layer 208 described above in block 1154 and resulting release of IC layer 3304 in block 1158 can be performed at different stages of the processes disclosed herein. In the implementation described above with reference to FIG. 1C, these operations are performed after the formation of conductive contact pads and attachment of conductive deposits, e.g., in the form of solder balls, to the conductive contact pads. In an alternative implementation, as shown in FIGS. 36 and 37, SAC layer 208 is removed to release IC layer 3304 before performing such operations. In this implementation, following the removal of SAC layer 208, Ni layer 3104*a* and Au plating layer 3108*a* are deposited in the exposed areas 3608 of conductive pads 3504 to define conductive contact pads on the exposed Cu plating for external devices to be electrically coupled with the device. In addition, further sets of Ni 3104*b* and Au plating 3108*b* layers can be deposited on the opposite side of IC layer 3304 from layers 3104*a* and 3108*a*, since the SAC layer 208 has been removed. In the example of FIG. 38, conductive contact pads including layers 3104*b* and 3108*b* are deposited onto exposed regions of Cu plating 604. In this way, one or more of the electronic components described above can have at least two placed terminals or ports. For example, a first terminal to a capacitor can be defined by the conductive contact pad including layers 3104*a* and 3108*a*, and a second terminal to a capacitor can be defined by the conductive contact pad including layers 3104*b* and 3108*b*.

Figure 39:
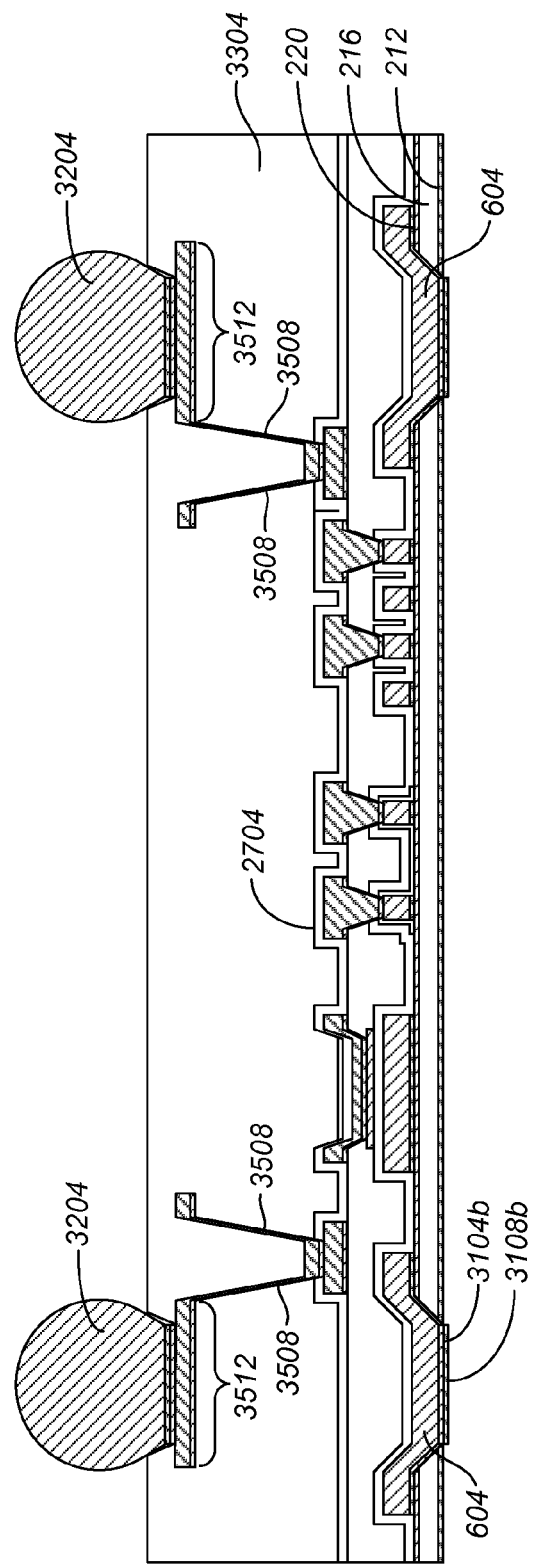
Figure 40:
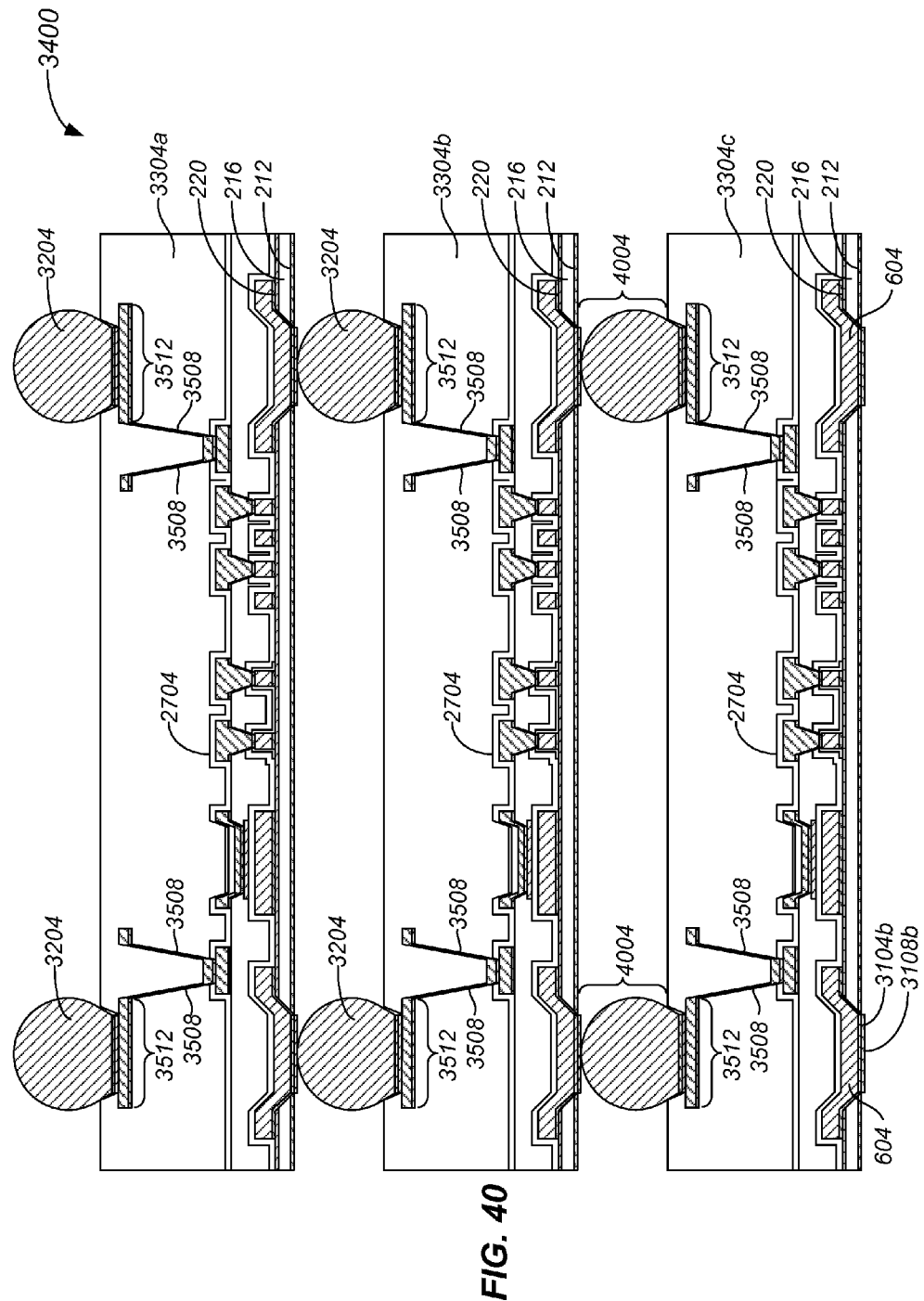

In FIGS. 39 and 40, solder balls 3204 can be attached to any of the sets of conductive contact pads on either side of an IC device layer, and a plurality of IC device layers 3304*a-c* can be stacked and coupled to one another via the solder balls, as described above with respect to FIGS. 32 and 34, and blocks 1150 and 1162. The air gaps described above are provided by virtue of the lengths 4004 of portions of the solder balls 3204 protruding from the thin polymer layer 3604.

In another alternative implementation to those described above, the Cu plating material used to define various conductive regions of the electrical components can be replaced with an Al alloy. Such may be desirable in low frequency applications, since Al has a higher resistivity than Cu. The replacement of Cu plating with Al can also be appropriate in implementations where primarily dry etching processes are desired, and/or when fewer processing blocks are desired. For example, referring to the process of FIG. 1C, when Cu plating is replaced with Al alloy, the processing stages of deposition of a seed layer, e.g., as described in blocks 1032 and 1106, and seed layer removal, e.g., as described in blocks 1048 and 1122, can be omitted. Also, block 1028 involving deposition of an adhesion layer 404 can be omitted. Further, when an Al alloy is used instead of Cu plating, the formation of conductive contact pads on exposed conductive material, e.g., in FIG. 31 and block 1146, can be omitted. The exposed Al alloy can be in direct conductive contact with external devices.

In yet another alternative implementation, conductive deposits in the form of Au bumps can be applied instead solder balls, for example, in the alternative implementation including the further thin polymer layer described above with reference to FIGS. 35-40. Such an Au bump can be formed, for example, by ball bonding technology or electro-plating. In one implementation, the gas release process of block 1154 can be performed after Au bump attachment, similar to the process of FIG. 1C. In another implementation, Au bumps are attached after gas release block 1154. Returning to FIG. 40, the IC device layers 3304 can be attached by Au bumps rather than solder balls, for example, using thermocompression bonding or thermosonic bonding techniques.

Figure 41:
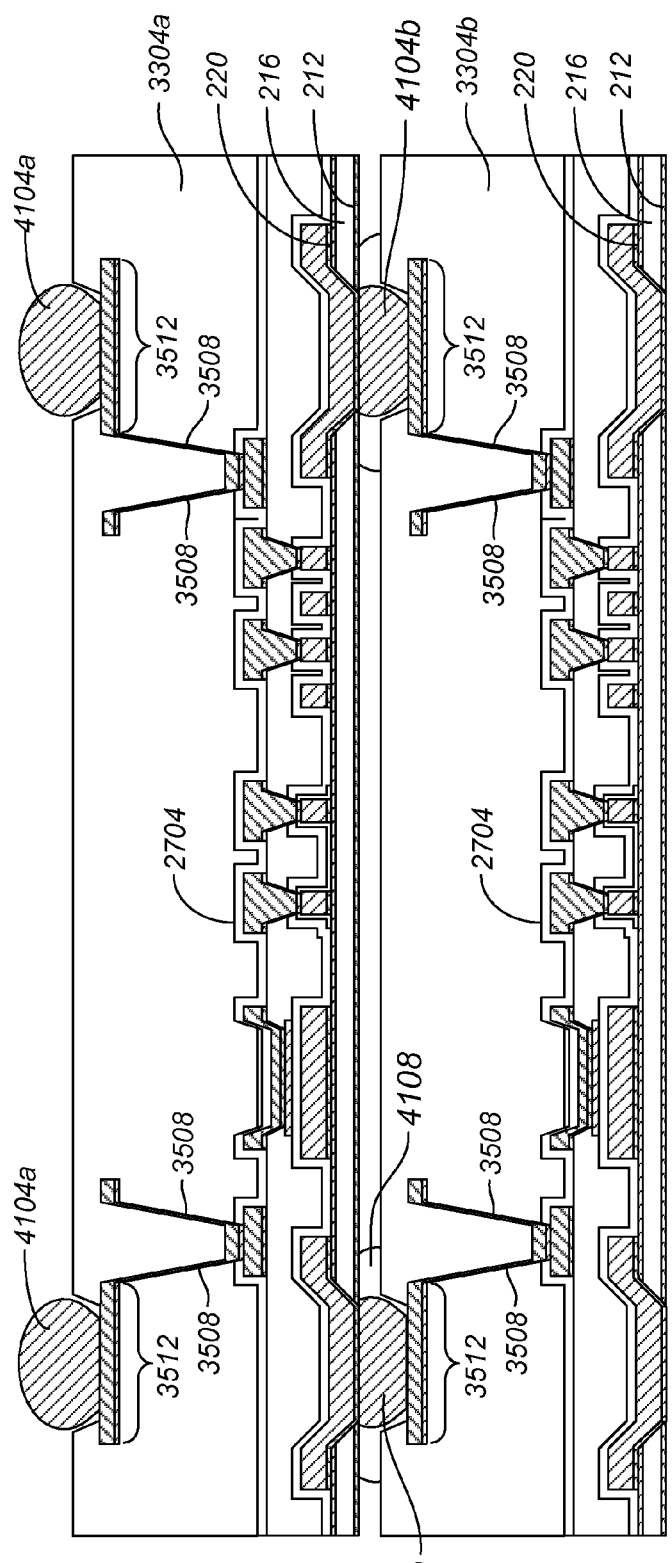
FIGS. 41 and 42 show examples of cross-sections of device fabrication stages in accordance with a process for forming an IC device, for instance, as an alternative to the processes illustrated in FIGS. 1A-C, including the use of a different conductive deposit material and an epoxy material between device layers.
Figure 42:
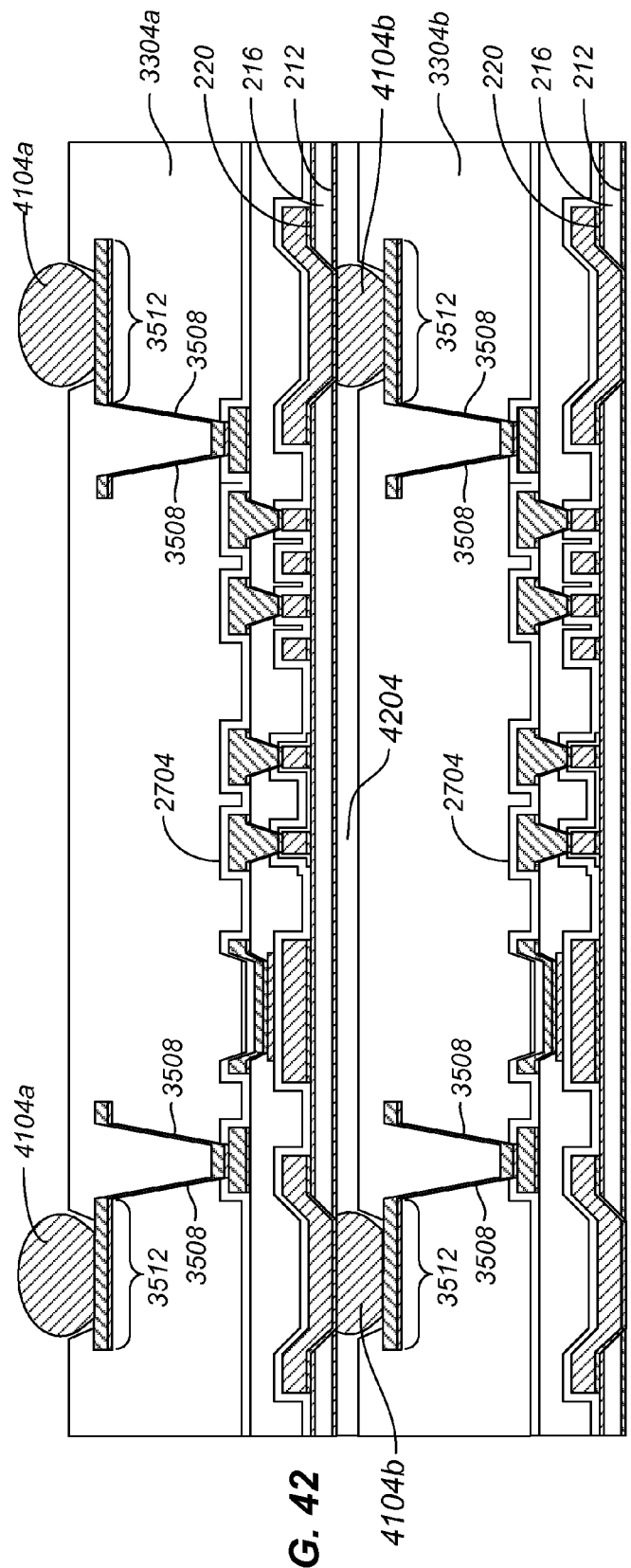

FIGS. 41 and 42 show examples of cross-sections of device fabrication stages in accordance with a process for forming an IC device, for instance, as an alternative to the processes illustrated in FIGS. 1A-C, including the use of a different conductive deposit material and an epoxy material between device layers. Other techniques for attaching stacked layers 3304 to one another involve the use of conductive epoxies and non-conductive epoxies between the layers. FIG. 41 shows a side view of stacked IC layers 3304*a* and 3304*b* with Au bumps 4104*a* and 4104*b* replacing solder balls 3204 of the stacked devices of FIGS. 34 and 40. Conductive epoxy is applied in a region proximate Au bumps 4104*b* to provide additional physical and electrical connectivity between the IC layers 3304*a* and 3304*b*. In FIG. 41, the stacked device layers are spaced apart from one another, similar to the implementations of FIGS. 34 and 40, with air gaps provided by virtue of the lengths of the portions of the Au bumps 4104*b* protruding from the thin polymer layer 3604.

FIG. 42 shows a side view of stacked IC layers 3304*a* and 3304*b* with a non-conductive epoxy 4204 applied in a region proximate Au bumps 4104*b* connecting the IC layers 3304*a* and 3304*b*. In one implementation, as shown in FIG. 42, the non-conductive epoxy is deposited in the form of a layer, essentially filling the air gaps that would otherwise be defined by the lengths of the protruding portions of the Au bumps 4104*b*.

Figure 43:
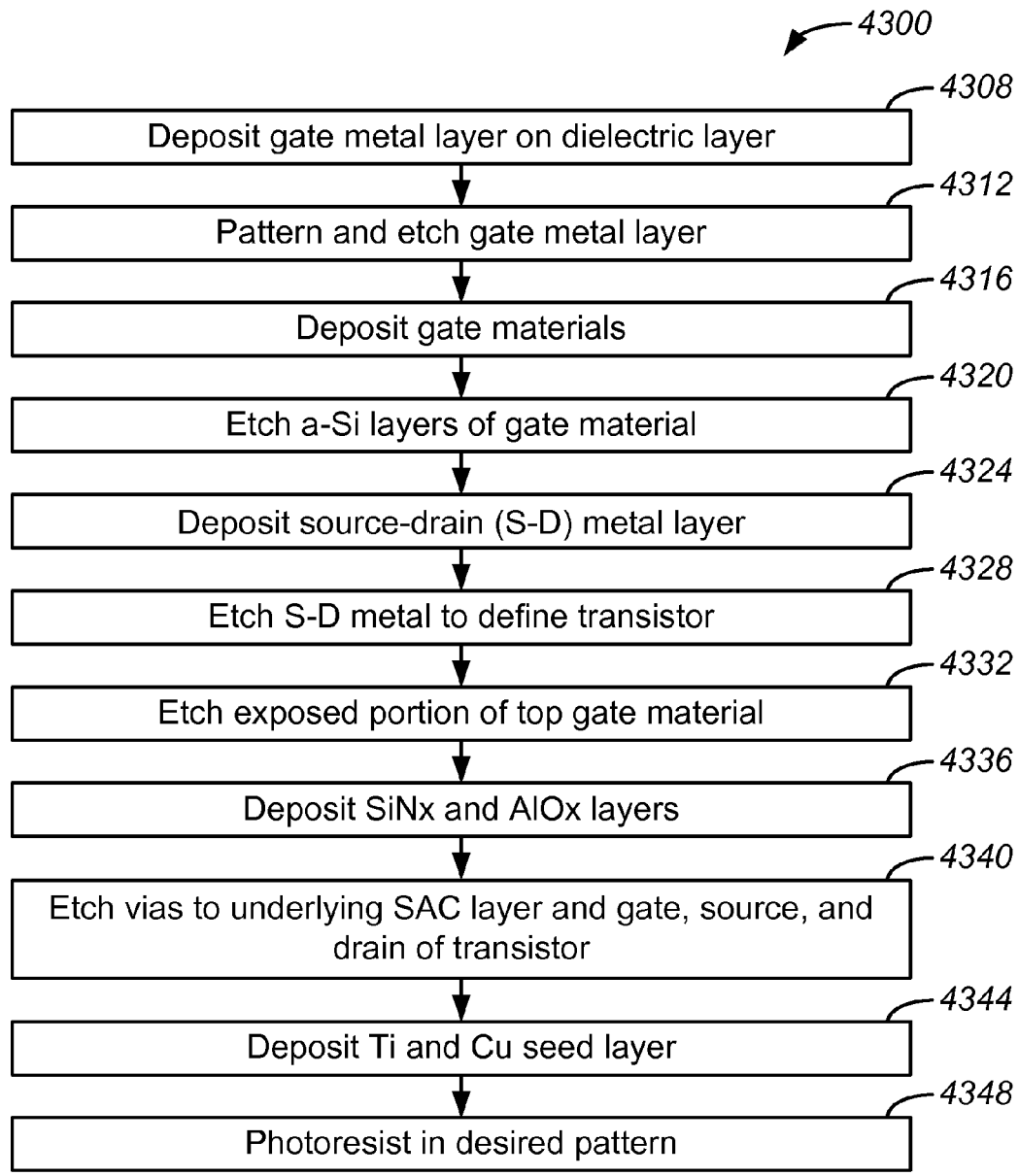
FIG. 43 shows an example of a flow diagram illustrating a process for forming an IC device with one or more active components, performed in accordance with another implementation.

In some implementations, one or more active components are formed in the IC devices as disclosed herein. For instance, thin-film transistors (TFT) such as a-Si TFTs and/or poly-Si TFTs can be fabricated on various layers and integrated in the IC device. FIG. 43 shows an example of a flow diagram of a process for forming an IC device with one or more active components, performed in accordance with one implementation. The process of FIG. 43 can be performed separately or can be combined with the process of FIG. 1C to produce a device having both active and passive components.

TFT fabrication processes are desirably performed in environments having high cleanliness and high temperatures. Thus, when one or more TFTs are to be incorporated with one or more passive components, in some implementations the TFTs are fabricated before fabricating the passive components to reduce the potential for contamination and topography. This can result in higher quality and higher yield of IC devices constructed in accordance with the techniques disclosed herein.

Figure 44:
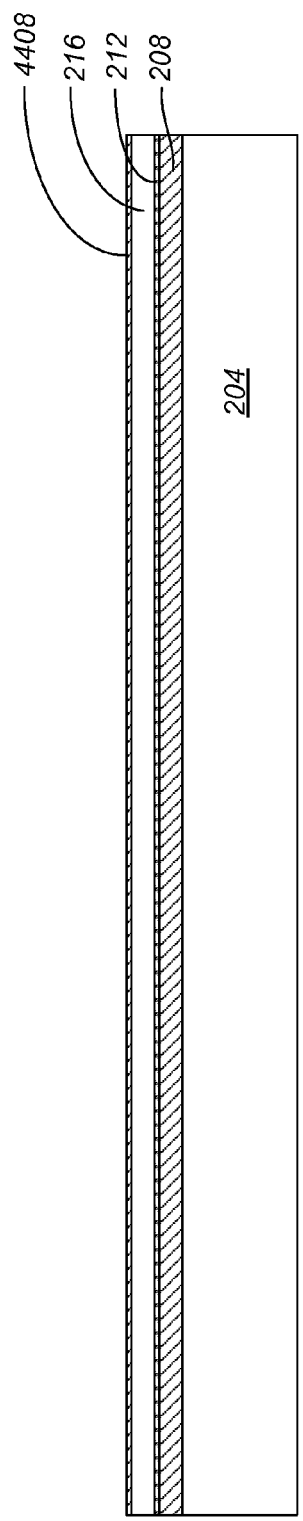
FIGS. 44-50 show examples of cross-sections of device fabrication stages in accordance with a process for forming an IC device, for instance, as represented in FIGS. 1A, 1B, and blocks 4308-4332 of the process illustrated in FIG. 43.

FIGS. 44-50 show examples of cross-sections of device fabrication stages in accordance with a process for forming an IC device, for instance, as represented in FIGS. 1A, 1B, and blocks 4308-4332 of the process illustrated in FIG. 43. In some implementations, when combining the process of FIG. 43 with the process of FIG. 1B or 1C, the blocks of FIG. 43 can be performed following the deposition of dielectric layer 216 in block 158 (FIG. 1B) or block 1016 (FIG. 1C). For example, rather than deposit a second AlOx layer 220 in block 1020 of FIG. 1C, a gate metal layer 4408 can be deposited on the dielectric layer 216 in block 4308. A side view of the IC device at this stage of fabrication is shown in FIG. 44. The gate metal layer 4408 can be Tantalum (Ta), Chromium (Cr), Mo, Ti, Titanium Tungsten (TiW), an Al alloy, or some combination of these materials.

Figure 45:
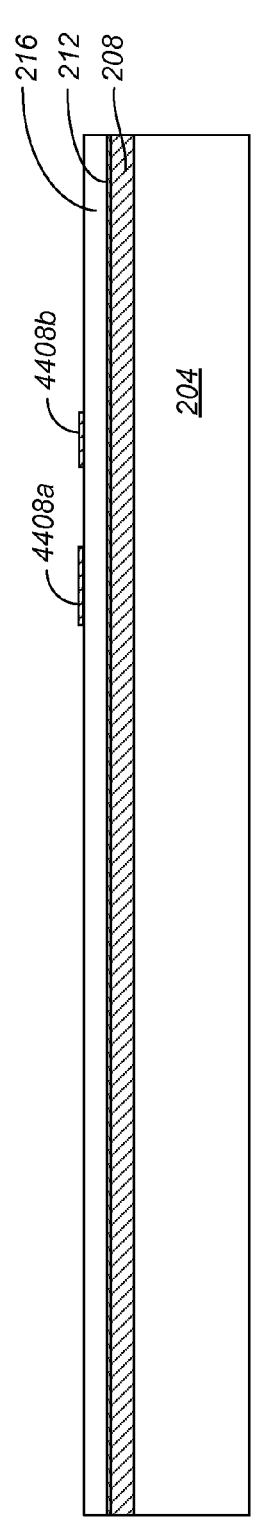
Figure 46:
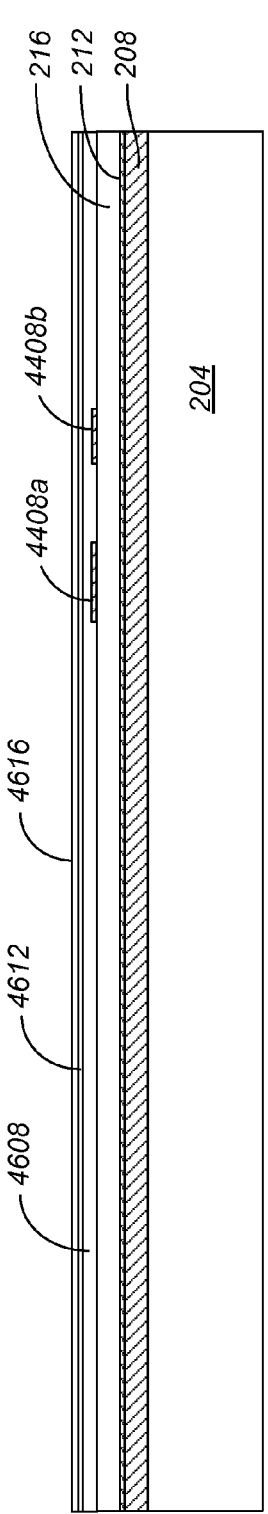
Figure 47:
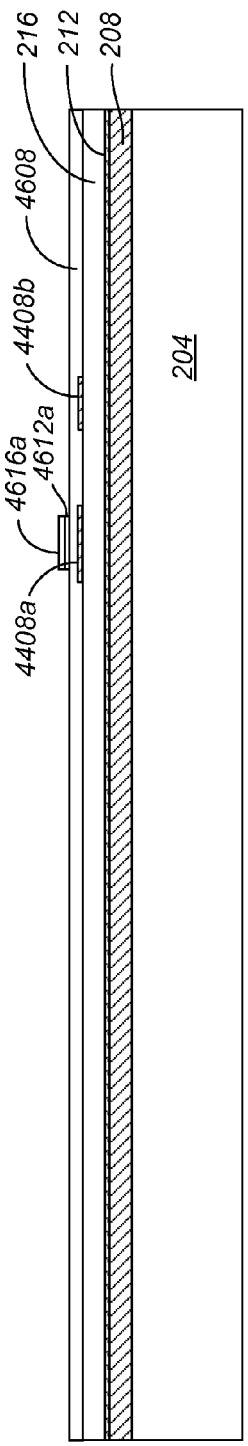

The process of FIG. 43 continues in block 4312, in which the gate metal layer 4408 is patterned and etched, for instance, using a Cl2 dry etch, to produce two gate metal portions 4408*a* and 4408*b*, as shown in FIG. 45. In block 4316, three gate materials are deposited, namely a SiNx layer 4608, followed by an i-type a-Si layer 4612, and an n-type a-Si layer 4616, as shown in FIG. 46. Suitable thicknesses of these layers are about 3000 Angstroms for layer 4608, 1000 Angstroms for layer 4612, and 200 Angstroms for layer 4616. In block 4320, the a-Si layers 4612 and 4616 are dry etched, for example, using a Cl2 plasma. As shown in FIG. 47, stacked a-Si portions 4612*a* and 4616*a* remain on the device and are situated above gate metal portion 4408*a*.

Figure 48:
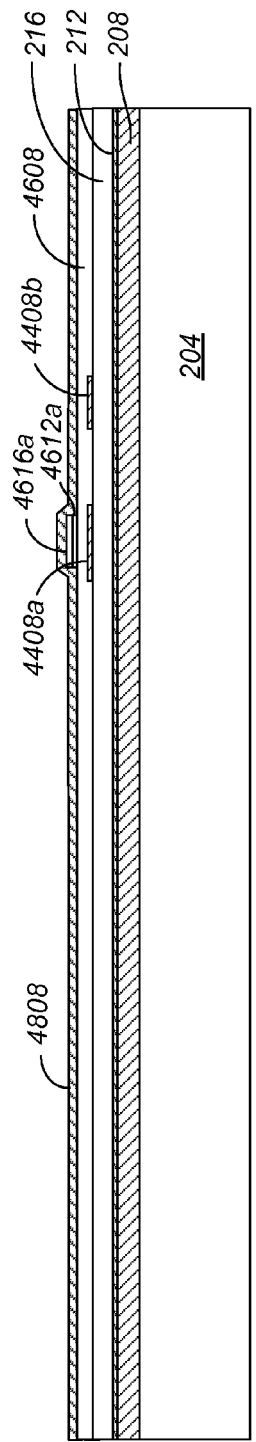
Figure 49:
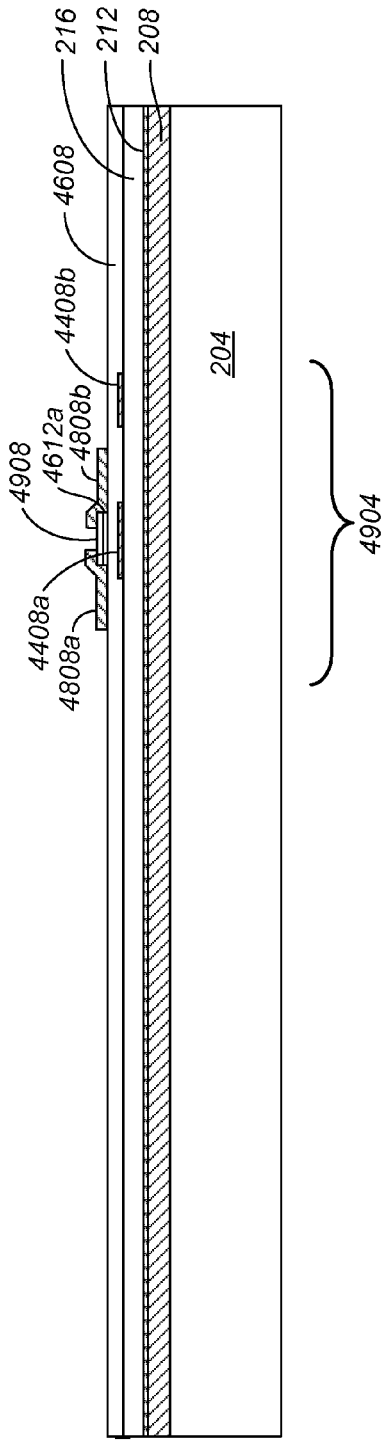
Figure 50:
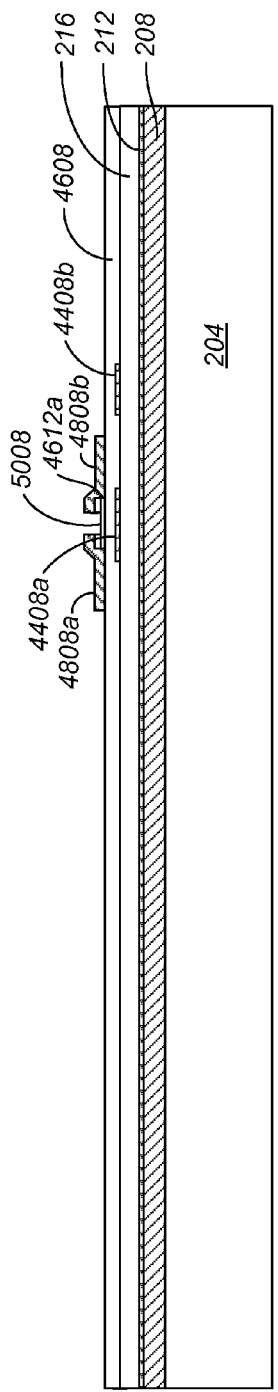

In block 4324 of FIG. 43, the process continues with the deposition of a source-drain (S-D) metal layer 4808, such as Mo, Mo/Al/Mo, TiW/Al/TiW, or another suitable S-D material, as shown in FIG. 48. In block 4328, S-D metal layer 4808 is dry etched, leaving source portion 4808*a* and drain portion 4808*b* of the metal, as shown in FIG. 49. Thus, a transistor 4904 is defined by the gate, source, and drain portions in the IC device. The etching process of block 4328 leaves an opening 4908 between portions 4808*a* and 4808*b*, exposing n-type Si portion 4616*a*. In this way, in block 4332, the exposed part of the top gate material, in this case, n-type Si portion 4616*a*, can be dry etched, thus exposing a part 5008 of underlying i-type a-Si layer 4612*a*, as shown in FIG. 50.

Figure 51:
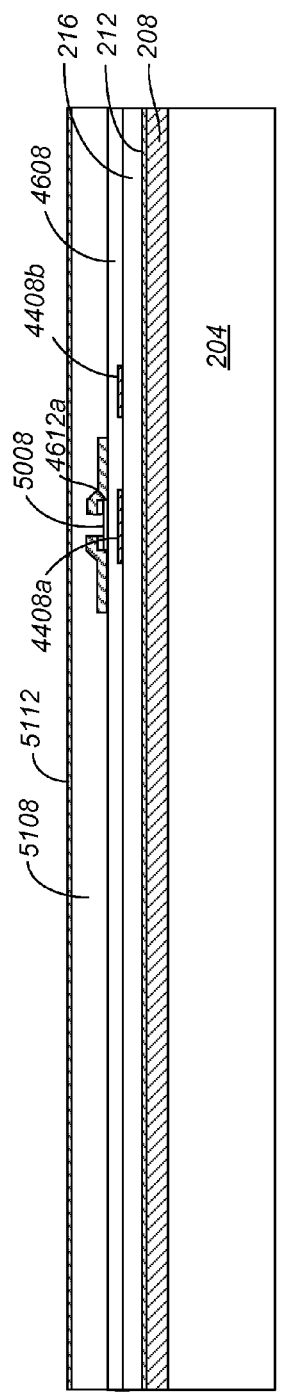
FIGS. 51-54 show examples of cross-sections of device fabrication stages in accordance with a process for forming an IC device, for instance, as represented in FIGS. 1A, 1B, and blocks 4336-4348 of the process illustrated in FIG. 43.
Figure 52:
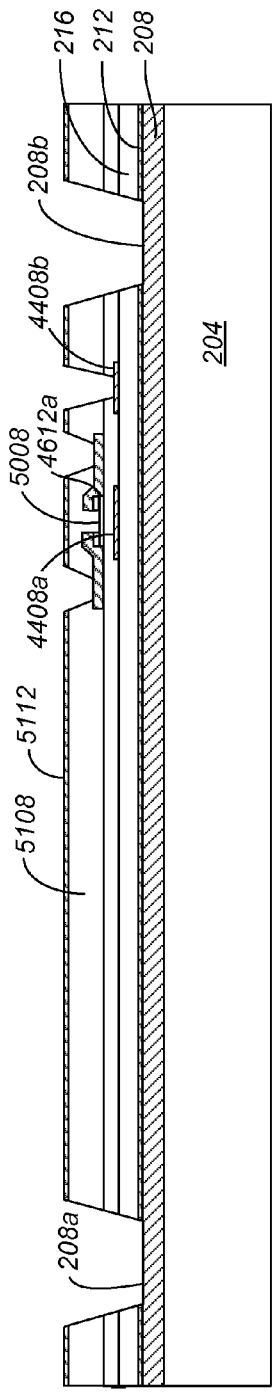
Figure 53:
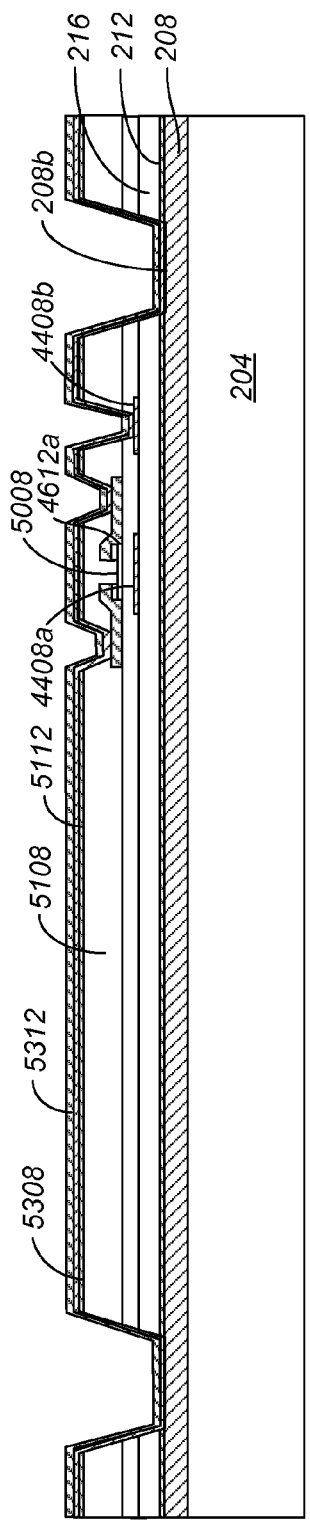
Figure 54:
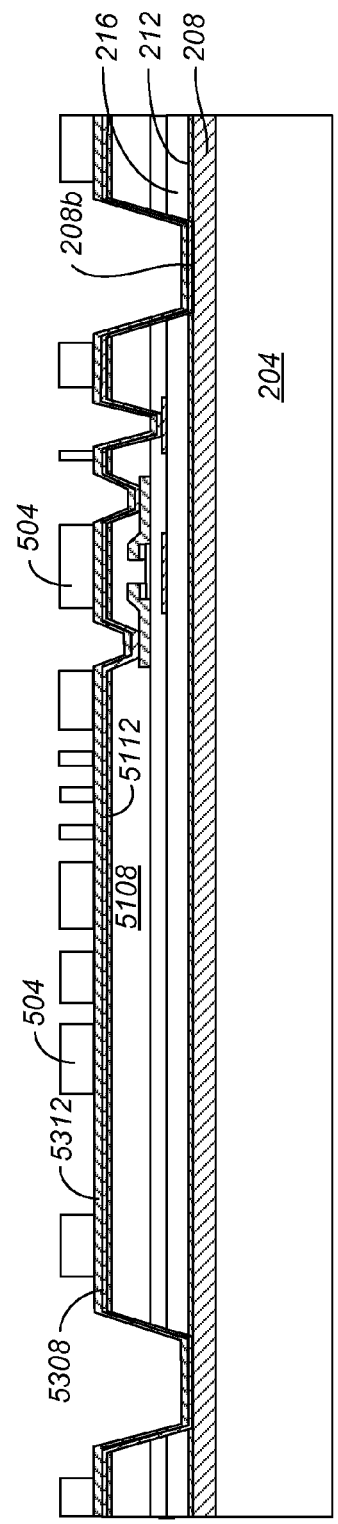

FIGS. 51-54 show examples of cross-sections of device fabrication stages in accordance with a process for forming an IC device, for instance, as represented in FIGS. 1A, 1B, and blocks 4336-4348 of the process illustrated in FIG. 43. In block 4336, in one implementation, a passivation layer of SiNx 5108 is deposited, followed by deposition of an AlOx layer 5112, as shown in FIG. 51. In block 4340, vias are etched to expose portions 208*a* and 208*b* of the underlying SAC layer, as well as the source 4808*a*, drain 4808*b*, and gate metal portion 4408*b*, as shown in FIG. 52. In 4340, the vias can be formed using wet and/or dry etching processes. An example of a suitable wet etch is BOE. For dry etching, BC13 can be used to remove portions of AlOx 5112, and CF4/O2 or SF6/O2 can be used to etch portions of SiNx layer 5108. In block 4344, a Ti layer 5308 and a Cu seed layer 5312 are deposited, for instance, as described above in blocks 1028 and 1032 of FIG. 1C.

FIG. 55 shows an example of a cross-section of a device fabricated in accordance with one or more processes for forming an IC device, for instance, as represented in FIGS. 1A-1C and FIG. 43. In block 4348 of FIG. 43, photoresist 504 is then deposited in a desired pattern, corresponding to block 1036 of FIG. 1C. Thus, in implementations in which it is desired to subsequently fabricate passive components on the device of FIGS. 44-54, flow can return to the process 1000 of FIG. 1C at block 1040, in which Cu plating is applied, followed by part or all of blocks 1044-1162. A resulting device layer including both active and passive components is shown in FIG. 55, and such a device layer can be stacked with similarly constructed device layers as described herein.

In some implementations, when integrating active and passive devices in the manners disclosed herein, active devices such as transistors can serve as electrostatic discharge (ESD) protection devices. That is, the integrated transistor can serve as the ESD protection device for the passive component in another region of the device.

While the techniques illustrated and described herein involve the fabrication of active components before forming passive components, these implementations are illustrative and not restrictive, and the application is intended to cover implementations in which IC devices are fabricated with only active components such as TFTs, as well as implementations in which passive components are fabricated in a device layer before fabricating active components. For example, because the disclosed processes are planar in nature, a TFT can be fabricated on a top layer of the device or a middle layer of the device. In addition, various types of TFTs can be constructed using the disclosed techniques, such as co-planar TFTs, top gate TFTs, and etch stopper type. The present application is also intended to cover the integration of low-temperature poly-Si TFTs. In addition, thin film diodes (TFD), while generally considered a passive device, can also be fabricated as part of an IC device using similar techniques as described above for fabricating TFTs.

The implementations of devices described above with respect to FIGS. 1-56 may be implemented in any electronic device that is configured to display an image, whether in motion (e.g., video) or stationary (e.g., still image), and whether textual or pictorial. More particularly, it is contemplated that the implementations may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry).

Figure 57:
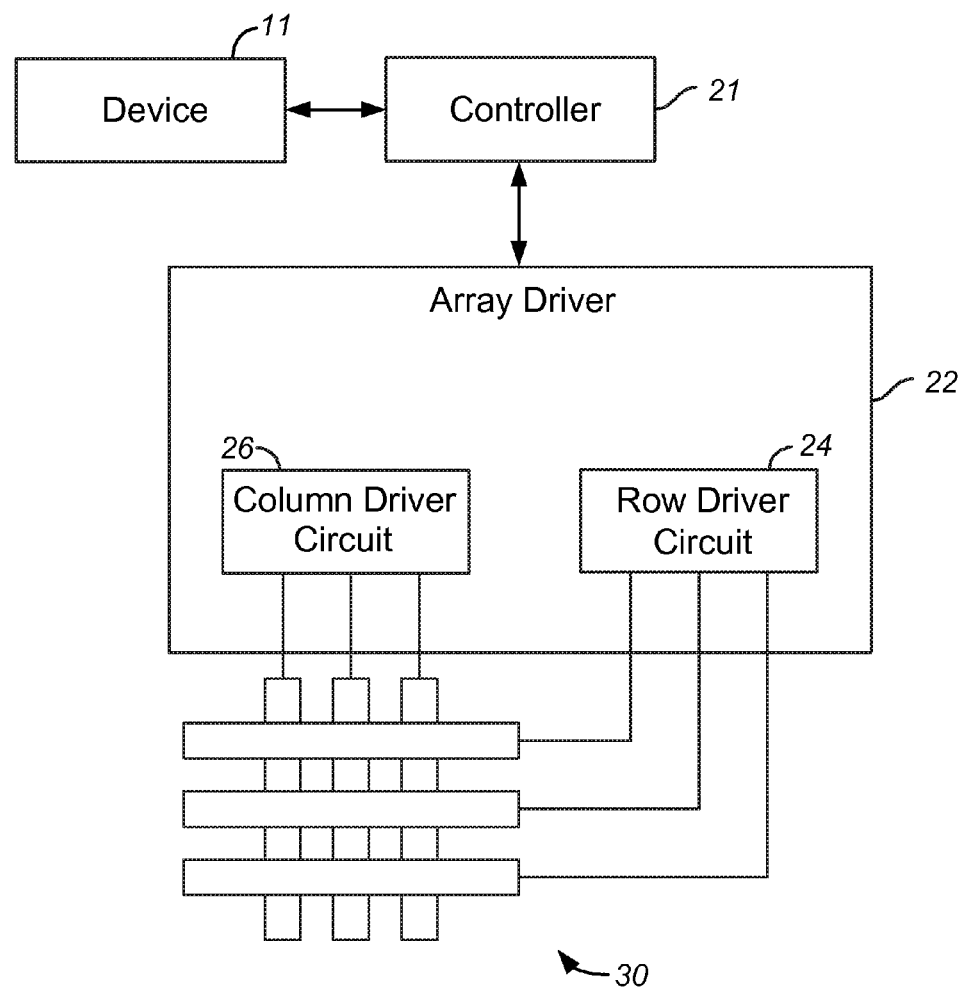
FIG. 57 shows an example of a system block diagram illustrating an electronic device incorporating an interferometric modulator display.

FIG. 57 shows an example of a system block diagram illustrating an electronic device incorporating a 3×3 interferometric modulator (IMOD) display. The electronic device of FIG. 57 represents one implementation in which an IC device 11 constructed in accordance with the implementations described above with respect to FIGS. 1-56 can be incorporated. For instance, device 11 could be a single device layer, as shown in FIG. 31, or a stacked IC device, as shown in FIG. 34. The electronic device in which device 11 is incorporated may, for example, form part or all of any of the variety of electrical devices and electromechanical systems devices set forth above, including both display and non-display applications.

Here, the electronic device includes a controller 21, which may include one or more general purpose single- or multi-chip microprocessors such as an ARM®, Pentium®, 8051, MIPS®, Power PC®, or ALPHA®, or special purpose microprocessors such as a digital signal processor, microcontroller, or a programmable gate array. Controller 21 may be configured to execute one or more software modules. In addition to executing an operating system, the controller 21 may be configured to execute one or more software applications, including a web browser, a telephone application, an email program, or any other software application.

The controller 21 is configured to communicate with device 11. The controller 21 can also be configured to communicate with an array driver 22. The array driver 22 can include a row driver circuit 24 and a column driver circuit 26 that provide signals to, e.g., a display array or panel 30. Although FIG. 57 illustrates a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 58A:
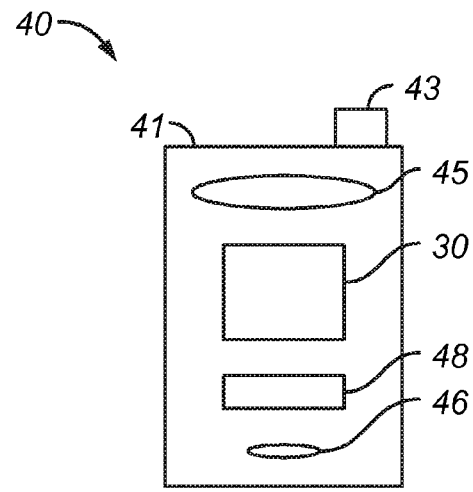
FIGS. 58A and 58B show examples of system block diagrams illustrating a display device that includes a plurality of interferometric modulators.
Figure 58B:
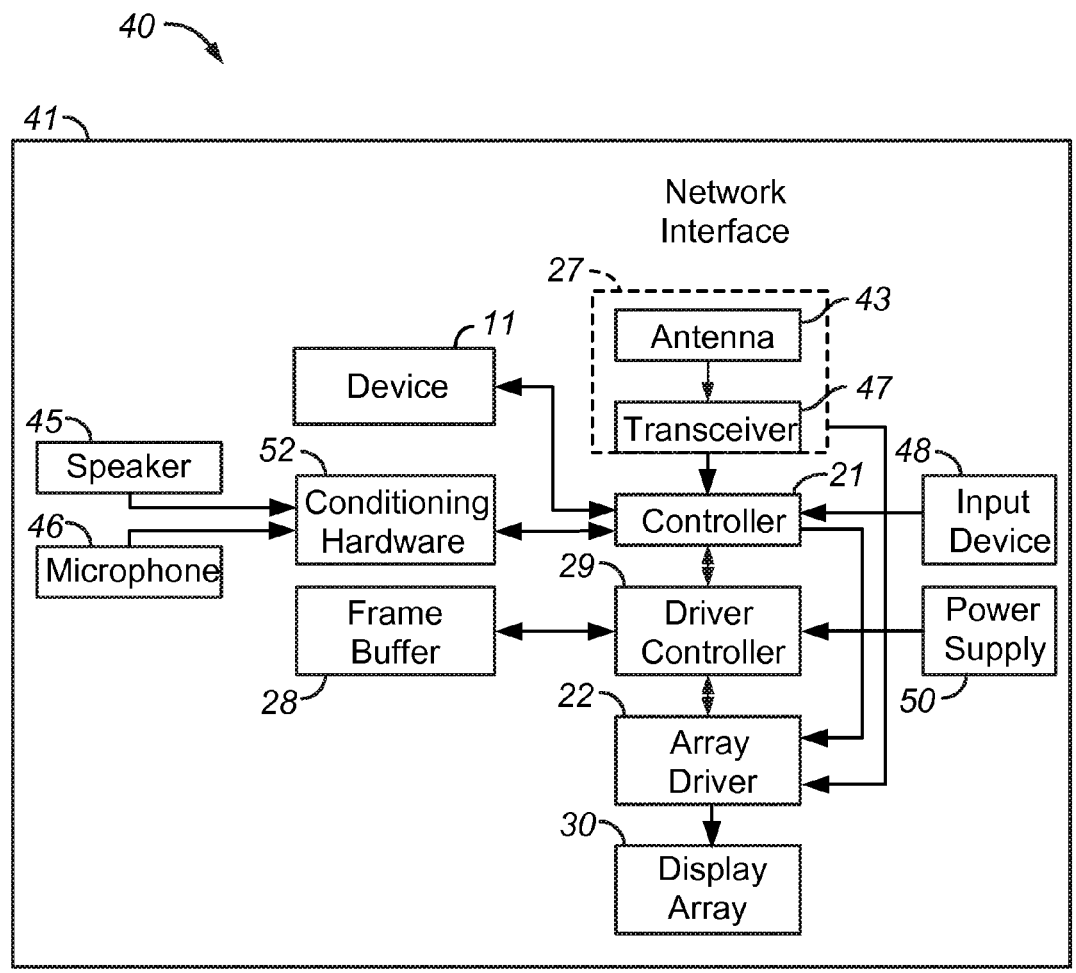

FIGS. 58A and 58B show examples of system block diagrams illustrating a display device 40 that includes a plurality of interferometric modulators. Display device 40 represents one example of an electronic device as described above. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 58B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level. Controller 21 is also configured to interact with device 11 to perform desired operations.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components. In one implementation, device 11 is incorporated as a component of conditioning hardware 52.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, modules, circuits and blocks described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
    a first coated device layer including:
        one or more first electronic components,
        a first lower polymer coating on the one or more first electronic components,
        one or more metal contacts over the first lower polymer coating and on exposed portions of the one or more first electronic components,
        a first upper polymer coating over the one or more metal contacts; and
    a second coated device layer including:
        one or more second electronic components,
        a second polymer coating on the one or more second electronic components;
    the second coated device layer disposed over the first coated device layer, the one or more first electronic components being in electrical communication with the one or more second electronic components through the one or more metal contacts, the first coated device layer and the second coated device layer not including a substrate; wherein the first coated device layer is spaced apart by a gap from the second coated device layer.

2. The device of claim 1, the first coated device layer further including:
    a first contact pad in electrical communication with the one or more first electronic components through the one or more metal contacts.

3. The device of claim 2, the second coated device layer further including:
    a second contact pad in electrical communication with the one or more second electronic components.

4. The device of claim 3, the first contact pad in electrical communication with the second contact pad via a solder ball.

5. The device of claim 4, a length of at least a portion of the solder ball defining the gap between the first coated device layer and the second coated device layer.

6. The device of claim 1, the electronic components including a transistor.

7. The device of claim 1 further comprising:
    a display;
    a processor configured to communicate with the display, the processor being configured to process image data; and
    a memory device configured to communicate with the processor.

8. The device as recited in claim 7 further comprising:
    a driver circuit configured to send at least one signal to the display.

9. The device as recited in claim 8 further comprising:
    a controller configured to send at least a portion of the image data to the driver circuit.

10. The device as recited in claim 7 further comprising:
    an image source module configured to send the image data to the processor.

11. The device as recited in claim 10, the image source module including at least one of a receiver, transceiver, and transmitter.

12. The device as recited in claim 7 further comprising:
    an input device configured to receive input data and to communicate the input data to the processor.

13. The device as recited in claim 1, wherein the gap is an air gap.

14. The device as recited in claim 13, wherein the air gap is configured to promote air flow between the first coated device layer and the second coated device layer.

15. The device as recited in claim 1, wherein a conductive region of the second coated device layer in electrical communication with the one or more second electronic components is exposed such that the one or more first electronic components are in electrical communication with the one or more second electronic components.

16. The device as recited in claim 15, further including a dielectric layer between the one or more second electronic components and the conductive region of the second coated device layer.

17. The device as recited in claim 1, wherein the first lower polymer coating coats upper and side regions of the one or more first electronic components, and wherein the first upper polymer coating coats upper and side regions of the one or more metal contacts.

18. The device as recited in claim 1, wherein the thickness of the first lower polymer coating is between about 10 microns and 20 microns, and the first upper polymer coating is greater than about 50 microns.

19. The device as recited in claim 18, wherein the thickness of the first lower polymer coating is between about 10 microns and 20 microns, and the first upper polymer coating is greater than about 200 microns.

* * * * *